(12) United States Patent
Wu et al.

(10) Patent No.: US 11,557,568 B2
(45) Date of Patent: Jan. 17, 2023

(54) PACKAGE AND MANUFACTURING METHOD THEREOF

(71) Applicant: Taiwan Semiconductor Manufacturing Co., Ltd., Hsinchu (TW)

(72) Inventors: Chih-Wei Wu, Yilan County (TW); Szu-Wei Lu, Hsinchu (TW); Ying-Ching Shih, Hsinchu (TW)

(73) Assignee: Taiwan Semiconductor Manufacturing Company. Ltd., Hsinchu (TW)

( * ) Notice: Subject to any disclaimer, the term of this patent is extended or adjusted under 35 U.S.C. 154(b) by 49 days.

(21) Appl. No.: 16/801,171

(22) Filed: Feb. 26, 2020

(65) Prior Publication Data
US 2021/0265306 A1 Aug. 26, 2021

(51) Int. Cl.
*H01L 25/065* (2006.01)
*H01L 23/31* (2006.01)
(Continued)

(52) U.S. Cl.
CPC ...... *H01L 25/0652* (2013.01); *H01L 21/4857* (2013.01); *H01L 21/561* (2013.01);
(Continued)

(58) Field of Classification Search
CPC ..... H01L 25/50; H01L 25/0657; H01L 21/78; H01L 25/0652; H01L 25/03; H01L 25/180657; H01L 21/4857; H01L 21/561; H01L 21/563; H01L 21/565; H01L 21/568; H01L 21/6835; H01L 21/6836; H01L 21/56; H01L 23/3128; H01L 23/3135; H01L 23/481; H01L 23/5386; H01L 23/49816; H01L 23/5389; H01L 24/16; H01L 24/17; H01L 2224/16146; H01L 2224/16235; H01L 2224/17181; H01L 2224/16145; H01L 2224/24225; H01L 2225/06513; H01L 2225/06517; H01L 2225/06548; H01L 2225/06565; H01L 2225/06586; H01L 2225/06541; H01L 2225/06582; H01L 2924/1434;
(Continued)

(56) References Cited

U.S. PATENT DOCUMENTS 8,993,380 B2 3/2015 Hou et al.
9,281,254 B2 3/2016 Yu et al.
(Continued)

*Primary Examiner* — Kyoung Lee
*Assistant Examiner* — Christina A Sylvia
(74) *Attorney, Agent, or Firm* — JCIPRNET

(57) ABSTRACT

A package includes at least one memory component and an insulating encapsulation. The at least one memory component includes a stacked memory structure and a plurality of conductive posts. The stacked memory structure is laterally encapsulated in a molding compound. The conductive posts are disposed on an upper surface of the stacked memory structure. The upper surface of the stacked memory structure is exposed from the molding compound. The insulating encapsulation encapsulates the at least one memory component. The top surfaces of the conductive posts are exposed form the insulating encapsulation. A material of the molding compound is different a material of the insulating encapsulation.

14 Claims, 23 Drawing Sheets

(51) Int. Cl.
  *H01L 23/00* (2006.01)
  *H01L 23/538* (2006.01)
  *H01L 21/56* (2006.01)
  *H01L 25/00* (2006.01)
  *H01L 21/48* (2006.01)
  *H01L 23/48* (2006.01)

(52) U.S. Cl.
  CPC .......... *H01L 21/563* (2013.01); *H01L 21/565* (2013.01); *H01L 21/568* (2013.01); *H01L 23/3128* (2013.01); *H01L 23/3135* (2013.01); *H01L 23/481* (2013.01); *H01L 23/5386* (2013.01); *H01L 24/16* (2013.01); *H01L 24/17* (2013.01); *H01L 25/50* (2013.01); *H01L 2224/16146* (2013.01); *H01L 2224/16235* (2013.01); *H01L 2224/17181* (2013.01); *H01L 2225/06513* (2013.01); *H01L 2225/06517* (2013.01); *H01L 2225/06548* (2013.01); *H01L 2225/06565* (2013.01); *H01L 2225/06586* (2013.01); *H01L 2924/1434* (2013.01)

(58) Field of Classification Search
  CPC ..... H01L 2924/181; H01L 2924/18161; H01L 2221/68331; H01L 2221/68345; H01L 2221/68372
  See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2012/0038045 A1* | 2/2012 | Lee | H01L 23/481 257/738 |
| 2012/0077314 A1* | 3/2012 | Park | H01L 23/3107 257/E21.705 |
| 2012/0088332 A1* | 4/2012 | Lee | H01L 21/561 438/113 |
| 2012/0282735 A1* | 11/2012 | Ahn | H01L 21/6835 438/109 |
| 2013/0082399 A1* | 4/2013 | Kim | H01L 24/97 257/774 |
| 2016/0218081 A1* | 7/2016 | Kim | H01L 24/20 |
| 2019/0385977 A1* | 12/2019 | Elsherbini | H01L 25/50 |

* cited by examiner

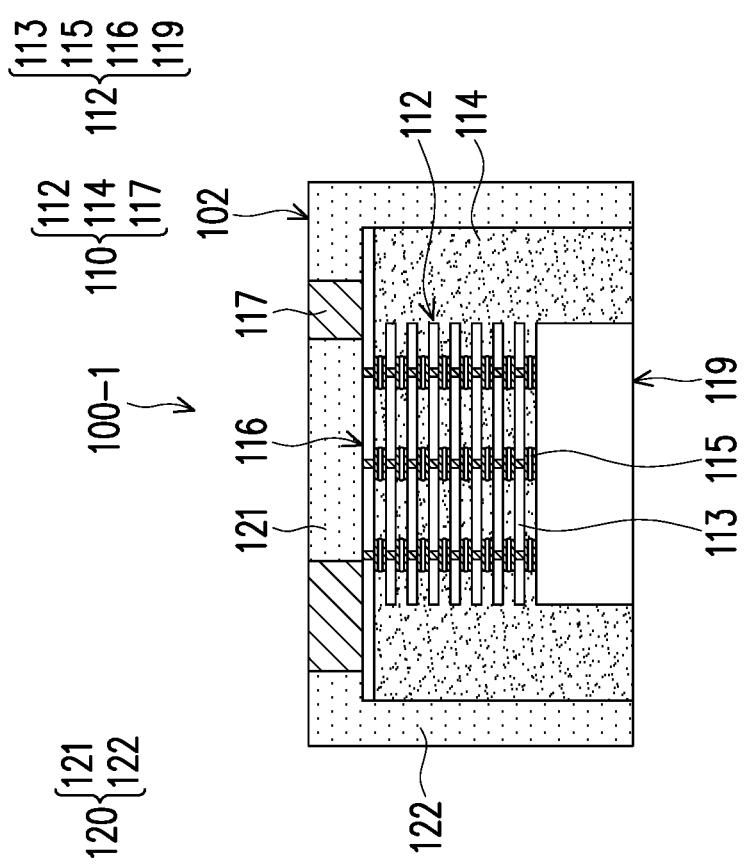

PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging (e.g., formation of redistribution circuit structure/layer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3G are schematic cross-sectional views of various stages in a manufacturing method of a package in accordance with some embodiments of the disclosure.

DETAILED DESCRIPTION

Figure 1A:
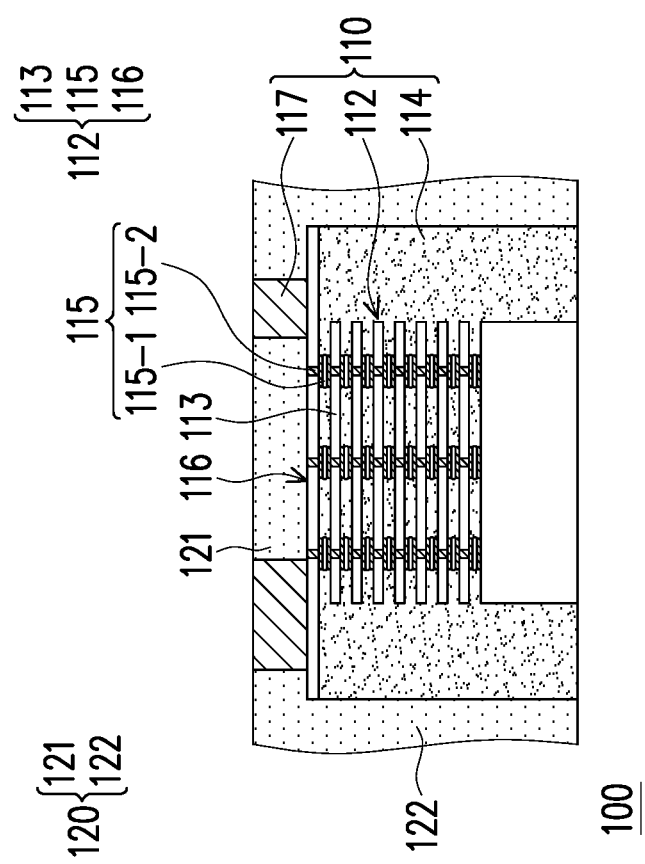
FIG. 1A is a schematic cross-section view illustrating a package of a memory component in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A is a schematic cross-section view illustrating a package 100 of a memory component 110 in accordance with some embodiments of the disclosure. Referring to FIG. 1A, in some embodiments, the package 100 includes at least one memory component 110 and a first insulating encapsulation 120. In some embodiments, the memory component 110 includes a stacked memory structure 112, a molding compound 114 and a plurality of conductive posts 117. The stacked memory structure 112 is laterally encapsulated in the molding compound 114. The conductive posts 117 are disposed on an upper surface 116 of the stacked memory structure 112. In some embodiments, the upper surface 116 of the stacked memory structure 112 is exposed from the molding compound 114. In some embodiments, the first insulating encapsulation 120 encapsulates the memory component 110. The top surfaces of the conductive posts 117 are exposed from the first insulating encapsulation 120. In addition, in some embodiments, a material of the molding compound 114 is different from a material of the insulating encapsulation 120.

In some embodiments, the memory component 110 may be a high bandwidth memory (HBM) component. In some alternative embodiments, the memory component 110 may be a dynamic random access memory (DRAM) component, a static random access memory (SRAM) component, a hybrid memory cube (HMC) component, or the like. In some embodiments, the stacked memory structure 112 includes a plurality of memory chips 113, a plurality of interconnecting structures 115, an upper surface 116. The memory chips 113 are vertically stacked over one another. Moreover, the interconnecting structures 115 electrically connect the memory chips 113 to, for example, the conductive posts 117. In some embodiments, the memory chips 113 may be HBM chips. In some alternative embodiments, the memory chips 113 may be DRAM chips, SRAM chips, HMC chips, or their combination. In some embodiments, the interconnecting structures 115 may include a plurality of through-silicon vias (TSVs) 115-1 and a plurality of microbumps 115-2. The microbumps 115-2 are respectively disposed between the vertically stacked memory chips 113. In addition, the TSVs 115-1 vertically pass through the memory chips 113 to interconnect with the microbumps 115-2 respectively.

In some embodiments, the molding compound 114 encapsulating the stacked memory structure 112 may be made of a resin (such as epoxy) material or the like. In some embodiments, the molding compound 114 may be formed by a molding process. In some embodiments, the conductive posts 117 are formed on the upper surface 116 to electrically connect with the interconnecting structure 115. In some embodiments, the conductive posts 117 are made of conductive materials including copper, copper alloy, or other suitable metal alloy containing copper metal, or the like. Referring to FIG. 1A, the top surfaces of the conductive posts 117 are coplanar with the top surface of the first insulating encapsulation 120. Moreover, the side surfaces of the conductive posts 117 are surrounded and protected by the first insulating encapsulation 120.

In some embodiments, the insulating encapsulation 120 includes a covering portion 121 and a side wall portion 122. Referring to FIG. 1A, the covering portion 121 covers the upper surface 116 of the stacked memory structure 112. In addition, the covering portion 121 surrounds and protects the side surfaces of the conductive posts 117. Moreover, the side wall portion 122 covers sidewalls of the molding compound 114. In some embodiments, the first insulating encapsulation 120 may be made of molded underfill (MUF), the disclosure is not limited thereto. In some alternative embodiments, the upper surface 116 of stacked memory structure 112 and the conductive posts 117 are both exposed from the insulating encapsulation 120, and merely the sidewalls of the molding compound 114 are covered by the side wall portion 122 of the first insulating encapsulation 120.

In some embodiments, a vertical thickness of the memory component 110 encapsulated in the first insulating encapsulation 120 may be varied. In some embodiments, the memory component 110 may have a thickness in a range of 695 microns to 745 microns.

Figure 1B:
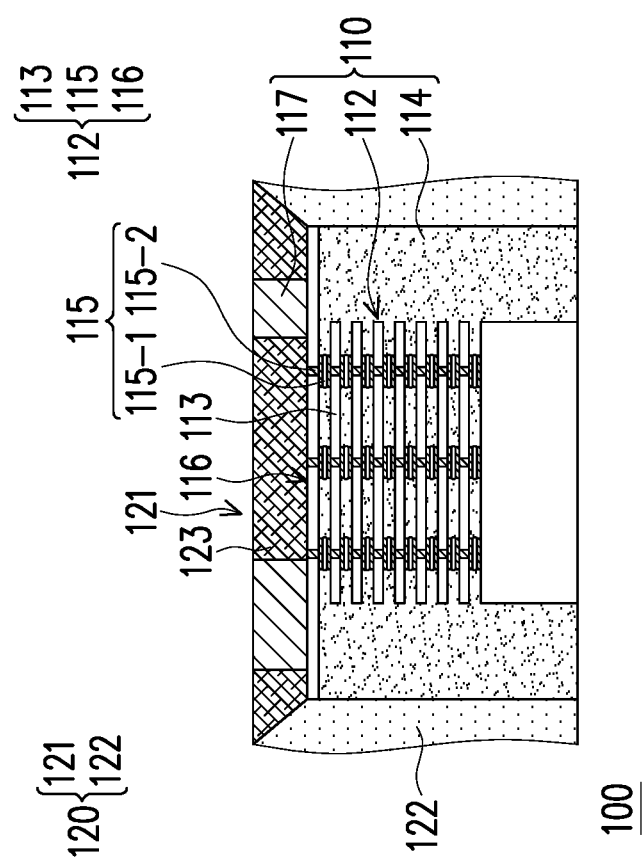
FIG. 1B is a schematic cross-section view illustrating a package of a memory component in accordance with some embodiments of the disclosure.

FIG. 1B is a schematic cross-section view illustrating a package 100 of a memory component 110 in accordance with some embodiments of the disclosure. Referring to FIG. 1B, in some embodiments, the covering portion 121 may include an underfill layer 123, and the underfill layer 123 is disposed above the upper surface 116 of the stacked memory structure 112. In some embodiments, the underfill layer 123 is made of a material different from that of rest portion of the first insulating encapsulation 120.

Figure 2A:
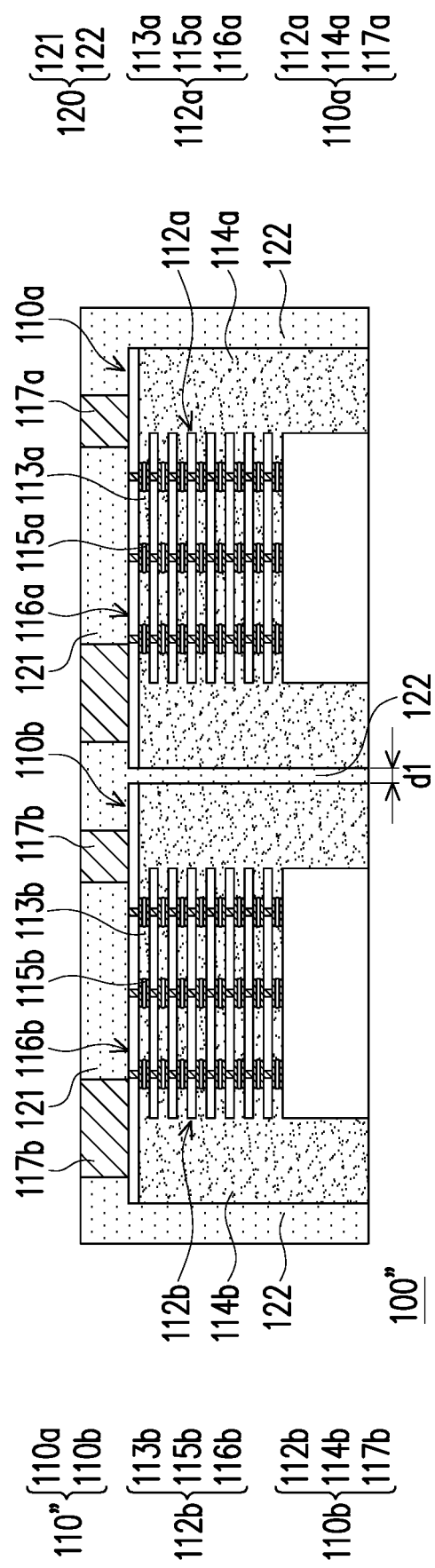
FIG. 2A is a schematic cross-section view illustrating a package of a memory component in accordance with some embodiments of the disclosure.

FIG. 2A is a schematic cross-section view illustrating a package 100" of a memory component 110" in accordance with some embodiments of the disclosure. In some embodiments, the memory component 110" may include a first memory component 110a and a second memory component 110b. The first memory component 110a and the second memory component 110b respectively include the stacked memory structures 112a, 112b, the molding compound 114a, 114b and the conductive posts 117a, 117b. The stacked memory structures 112a, 112b are respectively molded in the molding compound 114a, 114b, and the conductive posts 117a, 117b are exposed from and surrounded by the molding compounds 114a, 114b respectively. In some embodiments, the stacked memory component 112a and the stacked memory component 112b may respectively include a plurality of memory chips 113a, 113b stacked over one another, the interconnecting structures 115a, 115b, and the upper surfaces 116a, 116b. The interconnecting structures 115a, 115b electrically connect the memory chips 113a, 113b to the conductive posts 117a, 117b. In some embodiments, the memory chips 113a of the stacked memory structure 112a may be different from the memory chips 113b of the stacked memory structure 112b in terms of their structures or functions, the disclosure is not limited thereto.

As shown in FIG. 2A, in some embodiments, the first memory component 110a and the second memory component 110b are commonly encapsulated in the first insulating encapsulation 120. In some embodiments, a gap width d1 between the first memory component 110a and the second memory component 110b is less than 5000 microns. In some embodiments, the first insulating encapsulation 120 includes the covering portion 121 and the side wall portion 122. Referring to FIG. 2A, the covering portion 121 respectively covers the upper surfaces 116a, 116b of the stacked memory structure 112a, 112b, and the side wall portion 122 respectively surrounds and covers the sidewalls of the molding compounds 114a, 114b of the first and second memory components 110a, 110b. In the disclosure, through commonly packaging and encapsulating the first memory component 110a and the second memory component 110b in the first insulating encapsulation 120, the gap width d1 therebetween could be further reduced comparing to a scenario of separately encapsulating the first memory component 110a and the second memory component 110b and then laterally arranging them in a side-by-side manner. Accordingly, a dimension (e.g., a horizontal width) of the package 100" could be further minimized.

Figure 2B:
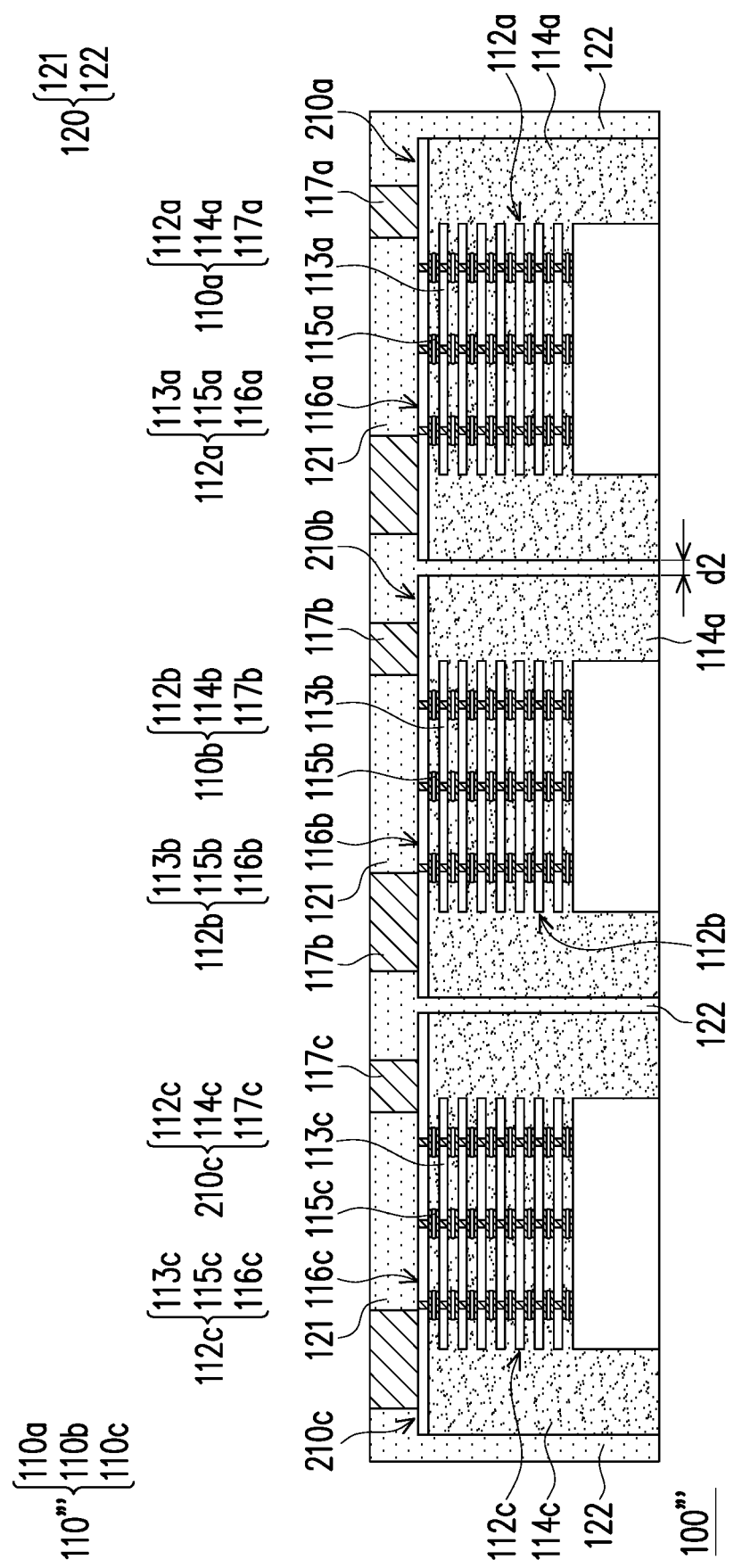
FIG. 2B is a schematic cross-section view illustrating a package of a memory component in accordance with some embodiments of the disclosure.

FIG. 2B is a schematic cross-section view illustrating a package 100''' of a memory component 110''' in accordance with some embodiments of the disclosure. In some embodiments, the memory component 110" in FIG. 2A may further include a third memory component 110c to form a memory component 110''''. The third memory component 110c includes a stacked memory structure 112c, a molding compound 114c and conductive posts 117c. As shown in FIG. 2B, the stacked memory structure 112c is molded in the molding compound 114c, and the conductive posts 117c are exposed from and surrounded by the molding compound 114c. In some embodiments, the stacked memory structure 112c includes an upper surface 116c, a plurality of memory chips 113c stacked over one another, and interconnecting structures 115c. As shown in FIG. 2B, the interconnecting structures 115c electrically connect the memory chips 113c to the conductive posts 117c. Referring to FIG. 2B, the third memory component 110c is commonly encapsulated by the first insulating encapsulation 120 with the first memory component 110a and the second memory component 110b in a side-by-side fashion. In some embodiments, the covering portion 121 of the first insulating encapsulation 120 also covers the upper surface 116c of the stacked memory structure 112c. In addition, the side wall portion 122 surrounds and covers sidewalls of the molding compound 114c of the third memory component 110c.

As mentioned above, the first memory component 110a, the second memory 110b component, and the third memory component 110c are arranged in a side-by-side fashion and commonly encapsulated by the first insulating encapsulation 120. Referring to FIG. 2B, a gap width d2 between each two of the first memory component 110a, the second memory component 110b, and the third memory component 110c is less than 5000 microns. In the current embodiment, the gap width d2 between the first memory component 110a, the second memory component 110b, and the third memory component 110c commonly encapsulated in the first insulating encapsulation 120 could be further reduced comparing to a scenario of separately encapsulating the first, second and third memory components 110a, 110b and 110c and then laterally arranging them in a side-by-side manner, so as to reduce a dimension (e.g., a horizontal width) of the package 100'''.

Referring again to FIG. 1A, FIG. 2A and FIG. 2B, in some alternative embodiments, the package 100 may include different numbers of the memory components 110 to be commonly encapsulated in the first insulating encapsulation 120 to form a single die unit or to form several different die units, the configuration of the each die unit may be varied based on the practical needs, the disclosure is not limited thereto.

FIG. 3A to FIG. 3G are schematic cross-sectional views of various stages in a manufacturing method of a package 100 in accordance with some embodiments of the disclosure. In FIG. 3A to FIG. 3G, more than one memory components are shown to represent plural memory components, and one package is shown to represent plural package obtained following the manufacturing method, however, the disclosure is not limited thereto.

Figure 3A:
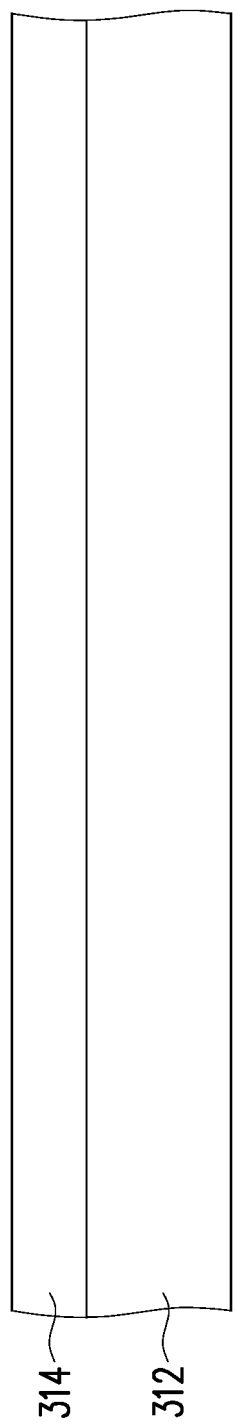

Referring to FIG. 3A, in some embodiments, a carrier 312 with a debond layer 314 coated thereon is provided. In one embodiment, the carrier 312 may be a glass carrier or any suitable carrier for carrying a semiconductor wafer or a reconstituted wafer for the manufacturing method of the semiconductor package. In some embodiment, the debond layer 314 may be any material suitable for bonding and debonding the carrier 312. In some embodiments not illustrated, the debond layer 314 may include a release layer (such as a light-to-heat conversion ("LTHC") or an adhesive layer (such as an ultra-violet curable adhesive or a heat curable adhesive layer).

Figure 3B:
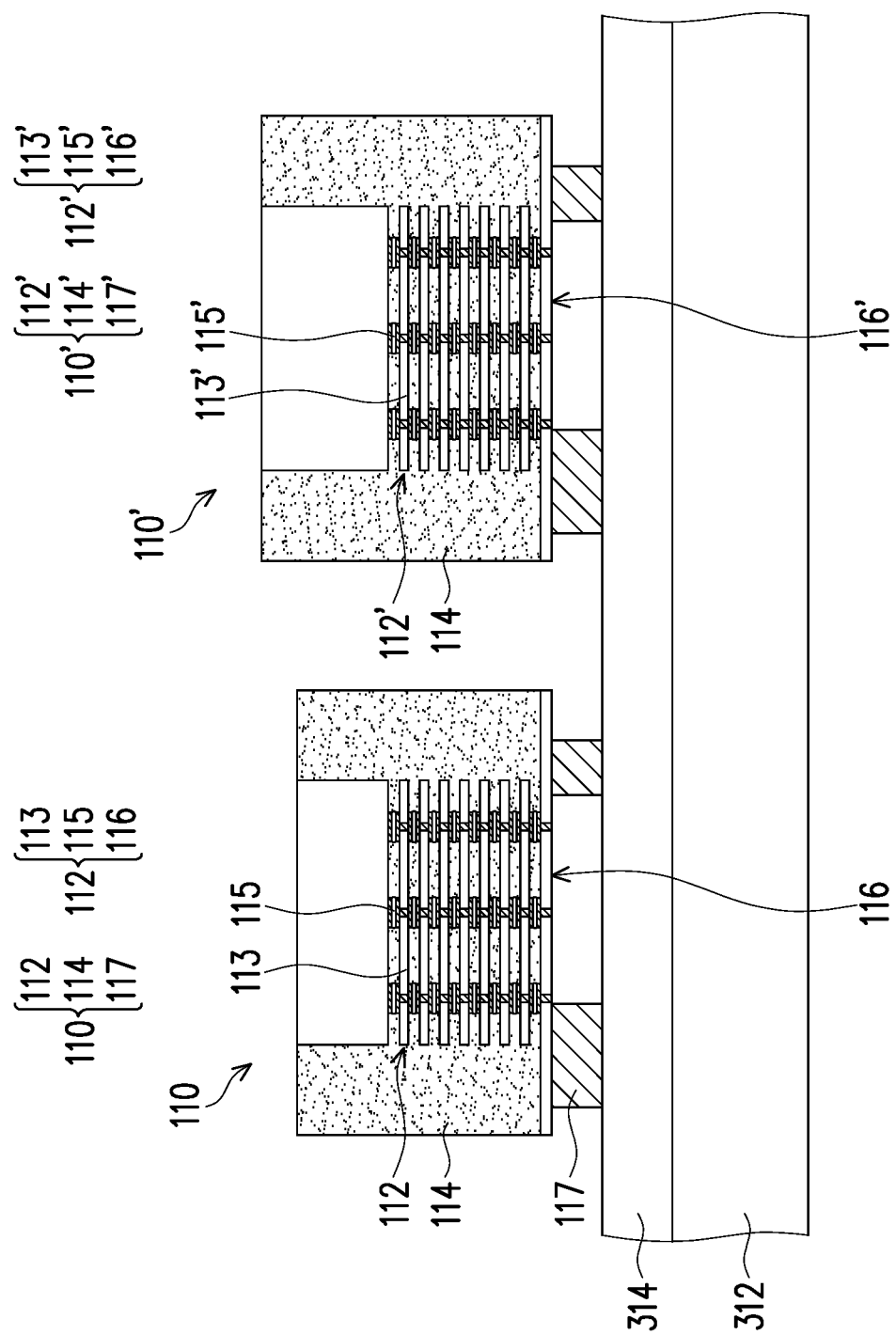

Referring to FIG. 3B, a plurality of memory components 110 (e.g., memory components 110 and 110' illustrated in FIG. 3B for illustration) are respectively disposed above the debond layer 314 and the carrier 312. In some embodiments, the memory components 110, 110' are both referred to as the memory components 110. As shown in FIG. 3B, only two memory components 110 (i.e., the memory components 110 and 110') are presented for illustrative purpose, however, it should be noted that the number of the memory components 110 may be one or more than one, the disclosure is not limited herein.

In some embodiments, the memory component 110 and the memory component 110' are varied in their overall vertical thicknesses. The memory component 110 and the memory component 110' may respectively include stacked memory structures 112, 112' molded in molding compounds 114, 114' and conductive posts 117, 117'. In addition, the stacked memory structures 112, 112' further include a plurality of memory chips 113, 113', interconnecting structures 115, 115', and upper surfaces 116, 116'. In some embodiments, the conductive posts 117, 117' are respectively disposed on the active surfaces 116, 116' of the stacked memory structure 112, 112'. In some embodiments, the difference of vertical thickness between the memory component 110 and the memory component 110' may be resulted from the thickness difference between the conductive posts 117 and the conductive posts 117' respectively disposed between the stacked memory structure 112, 112' and the debond layer 314. In some embodiments, the difference of vertical thickness between the memory component 110 and the memory component 110' may be resulted from the thickness difference between the stacked memory structure 112 and the stacked memory structure 112'. Specifically, the stacked memory structure 112 and the stacked memory structure 112' may respectively include different numbers of memory chips stacked over one another, the disclosure is not limited herein. In some embodiments, a variation between thicknesses of the memory component 110 and the memory component 110' is about 50 microns.

Figure 3C:
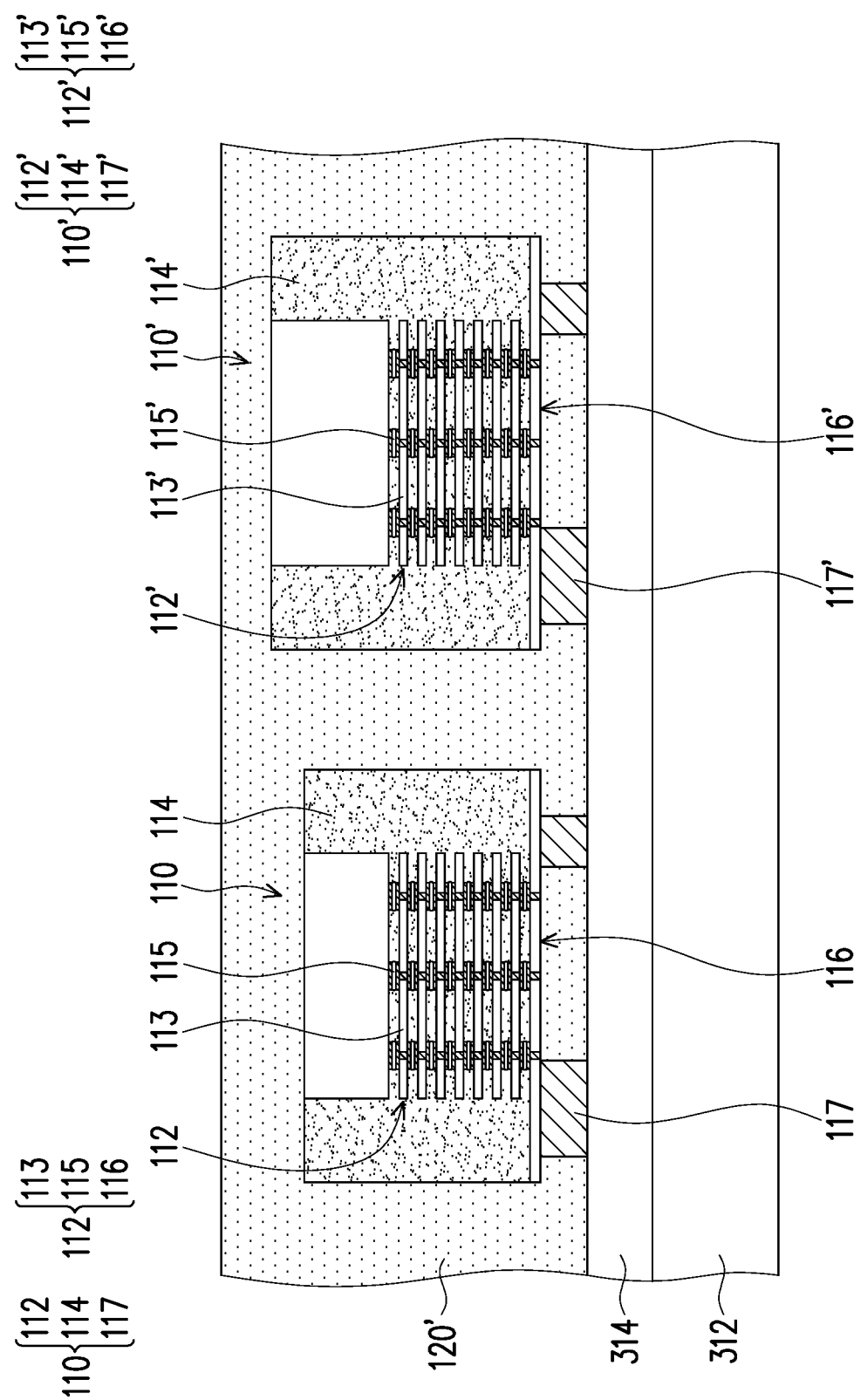

Referring to FIG. 3C, the memory component 110 and the memory component 110' are commonly encapsulated and fully covered by a first encapsulation material 120'. In some embodiments, the first encapsulation material 120' also fills the gap between the debond layer 314 and the upper surface 116 and the gap between the debond layer 314 and the molding compound 114. In some embodiments, the first encapsulation material 120' may include, for example, a resin material (such as epoxy resins, phenolic resins, silicon-containing resins, or other suitable resins), a dielectric material having low permittivity (DK) and low loss tangent (DF) properties, or other suitable materials. In an alternative embodiment, the first encapsulation material 120' may include an acceptable insulating encapsulation material. In some embodiments, the first encapsulation material 120' may further include inorganic fillers (e.g., silica) or other inorganic compounds to optimize coefficient of thermal expansion (CTE) of the first encapsulation material 120'. The disclosure is not limited thereto.

In an alternative example, the gap between the debond layer 314 and the upper surface 116 may be filled with an underfill material to form an underfill layer 123 to surround the conductive posts 117.

Figure 3D:
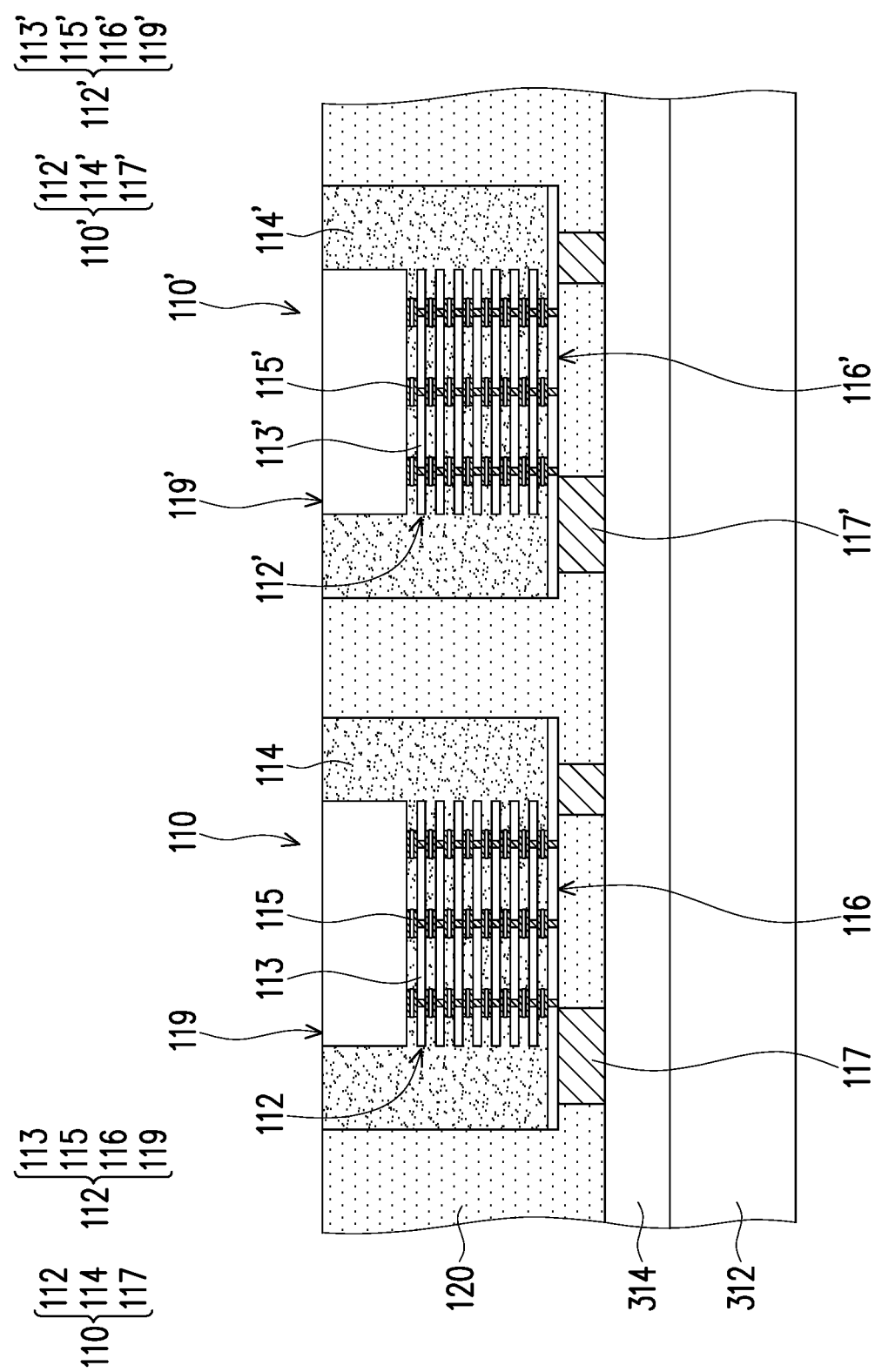

Referring to FIG. 3D, in some embodiments, the first encapsulation material 120' is grinded and planarized to form a first insulating encapsulation 120, so that the thickness of the memory component 110 is normalized to substantially equal with the thickness of the memory component 110', and thus the backsides 119, 119' of the stacked memory structures 112, 112' are coplanar and exposed from the first insulating encapsulation 120. As shown in FIG. 3D, the backsides 119 and 119' and the surface of the first insulating encapsulation 120 are collectively to form a flat surface, which is levelled and may have a high degree of coplanarity with a variation, for example, less than 5 microns. In some embodiments, the first encapsulation material 120' may be planarized by mechanical grinding or chemical mechanical polishing (CMP), for example. After the planarizing step, a cleaning step may be optionally performed, for example, to clean and remove the residue generated from the planarizing step. However, the disclosure is not limited thereto, and the planarizing step may be performed through any other suitable method. In the disclosure, the thicknesses of different memory components 110 (e.g., the memory component 110 and 110') commonly encapsulated in the first encapsulation material 120' could be normalized through the above planarization process, and thus the memory components 110 having different vertical thicknesses could be utilized and encapsulated in the same package process. Accordingly, a process window of thickness variation of the memory component 110 in the manufacturing method of the package 100 could be further enlarged.

Figure 3E:
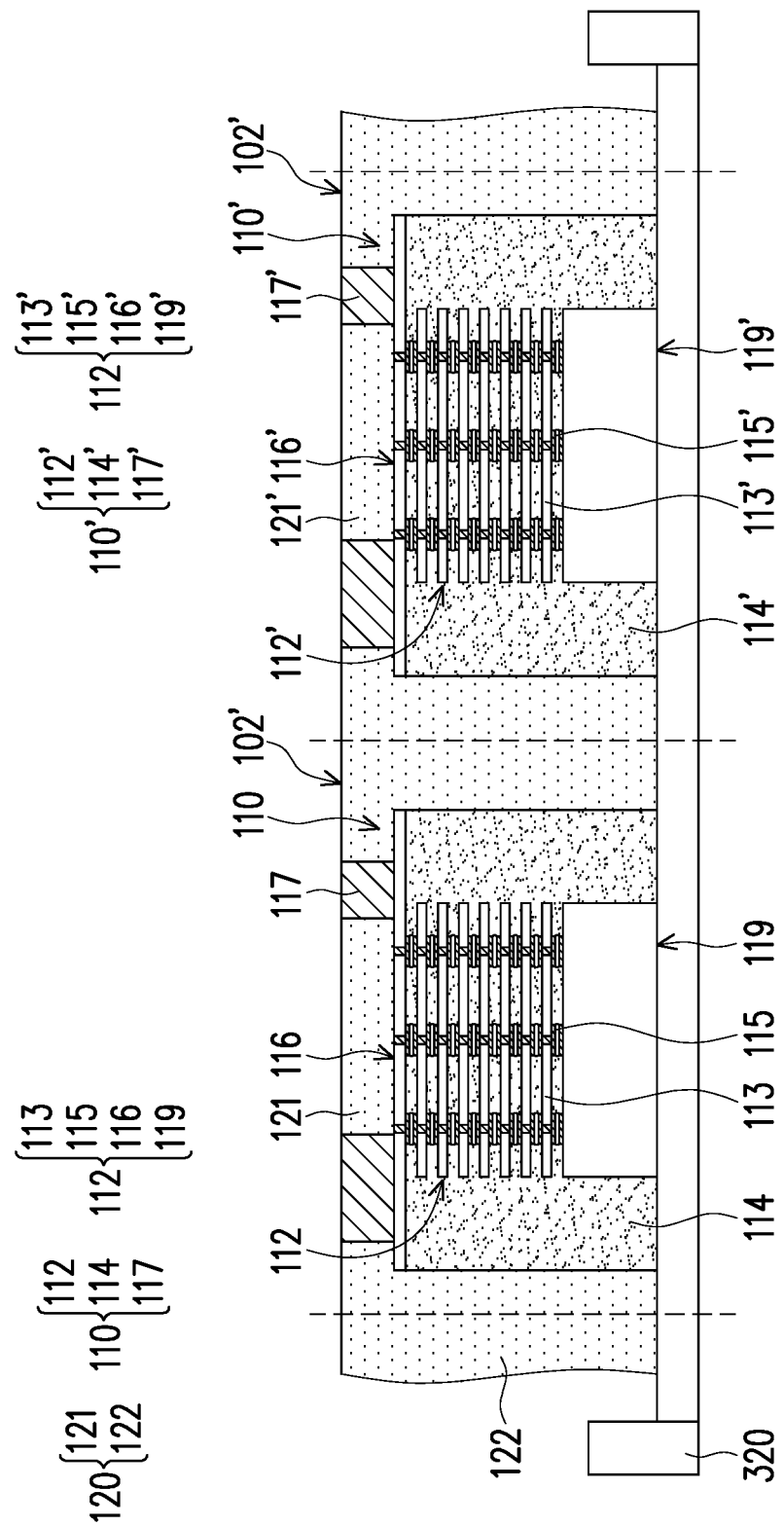

Referring to FIG. 3E, the abovementioned flat surface collectively formed by the backsides 119, 119' and the surface of the first insulating encapsulation 120 is attached to the carrier 320, so as to remove the carrier 312 and the debond layer 314 and to expose active surfaces 102, 102' substantially coplanar with each other. In some embodiments, the carrier 320 includes an adhesive tape. As shown in FIG. 3E, in some embodiments, the first insulating encapsulation 120 includes the covering portion 121 and the side wall portion 122. In some embodiments, the covering portion 121 covers the upper surfaces 116, 116' of the stacked memory structures 112, 122' and exposes the top surfaces of the conductive posts 117, 117', while the side wall portion 122 covers the sidewalls of the molding compounds 114, 114'.

Figure 3F:
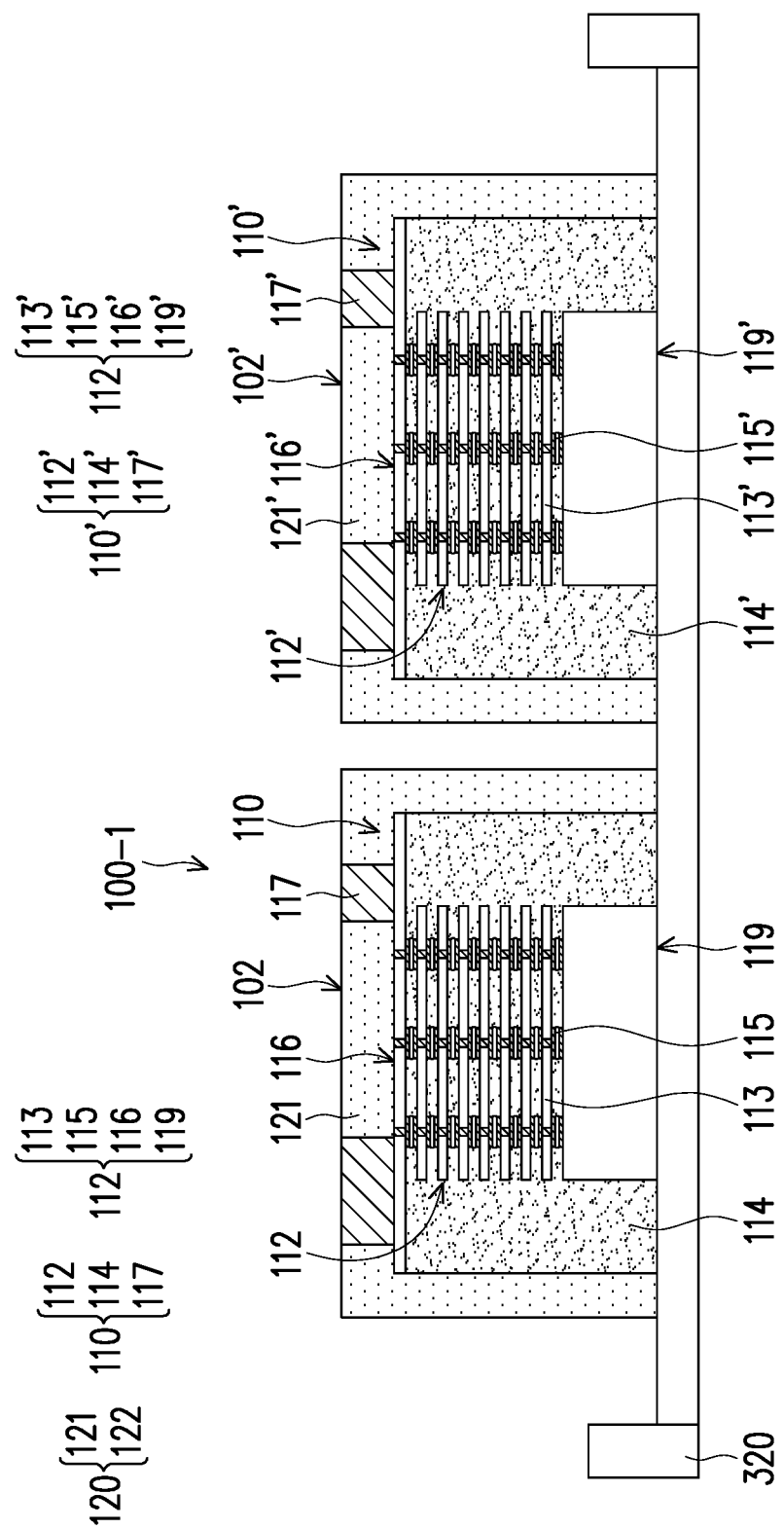

Referring to FIG. 3F and FIG. 3G, the first insulating encapsulation 120 is sawed along sawing lines to separate and form a plurality of first die units 100-1. Each of the first die units 100-1 includes at least one memory component 110 encapsulated in the first insulating encapsulation 120 as shown in FIG. 3G. In some embodiments, the first die unit 100-1 may include the memory component 110 and/or the memory component 110', the disclosure is not limited thereto. In some embodiments not illustrated, each of the first die units 100-1 may include additional memory components, other than memory components 110 and 110' mentioned above, commonly encapsulated by the first insulating encapsulation 120, the disclosure is not limited thereto. In some embodiments, the sawing process may be a wafer dicing process including mechanical blade sawing or laser cutting. In addition, as shown in FIG. 3G, the carrier 320 are removed to form the first die unit 100-1 after the dicing process.

Referring to FIG. 3G, through the abovementioned manufacturing method in FIG. 3A through FIG. 3F, particularly through encapsulation process illustrated in FIG. 3C and the normalization process in FIG. 3D, each of the first die units 100-1 substantially has the same vertical thickness or has a variation less than 5 microns. Accordingly, even a plurality of memory components 110 having different thicknesses are provided in a manufacturing process to form the first die units 100-1, there is no needs of firstly sorting the memory components 110 according to their respective thicknesses in advance, and thus the manufacturing cost could be reduced. In some embodiments, each first die unit 100-1 may include different numbers or different kinds/types of the memory components, for example, HBM or SDRAM.

FIG. 4A to FIG. 4H are schematic cross-sectional views of various stages in a manufacturing method of a package 200 in accordance with some embodiments of the disclosure. In some embodiments, the package 200 may include the first die units 100-1 manufactured by the abovementioned manufacturing process in FIG. 3A through FIG. 3G. and one or more second die unit 201, which includes at least one semiconductor chip structure 210.

Figure 4A:
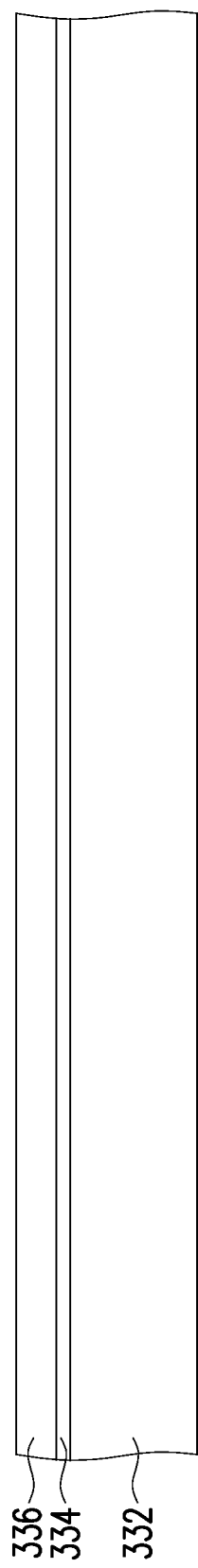
FIG. 4A to FIG. 4H are schematic cross-sectional views of various stages in a manufacturing method of a package in accordance with some embodiments of the disclosure.

Referring to FIG. 4A, a carrier 332 with a debond layer 334 and an adhesive layer 336 disposed thereon is provided. As shown in FIG. 4A, the debond layer 334 is sandwiched between the carrier 332 and the adhesive layer 336. In some embodiments, the carrier 332 may be a glass carrier or any suitable carrier for carrying a semiconductor wafer or a reconstituted wafer for the manufacturing method of the package 200. In some embodiments, the debond layer 334 is disposed on the carrier 332, and the material of the debond layer 334 may be any material suitable for bonding and debonding the above layers (e.g., the die attach film 336 depicted in FIG. 4A) or bonding and debonding any wafers (e.g., carrier 332 depicted in FIG. 4A) disposed thereon. In some embodiments not illustrated, the debond layer 334 may include a release layer (such as a light-to-heat conversion ("LTHC") layer). In some embodiments, the adhesive layer 336 may include a silver paste, a B-stage epoxy or a die attach film (DAF), the disclosure is not limited herein.

In some embodiments, for example, the debond layer 334 and the adhesive layer 336 may be formed by a suitable fabrication technique such as spin-coating, lamination, deposition or the like. The disclosure is not limited therein.

Figure 4B:
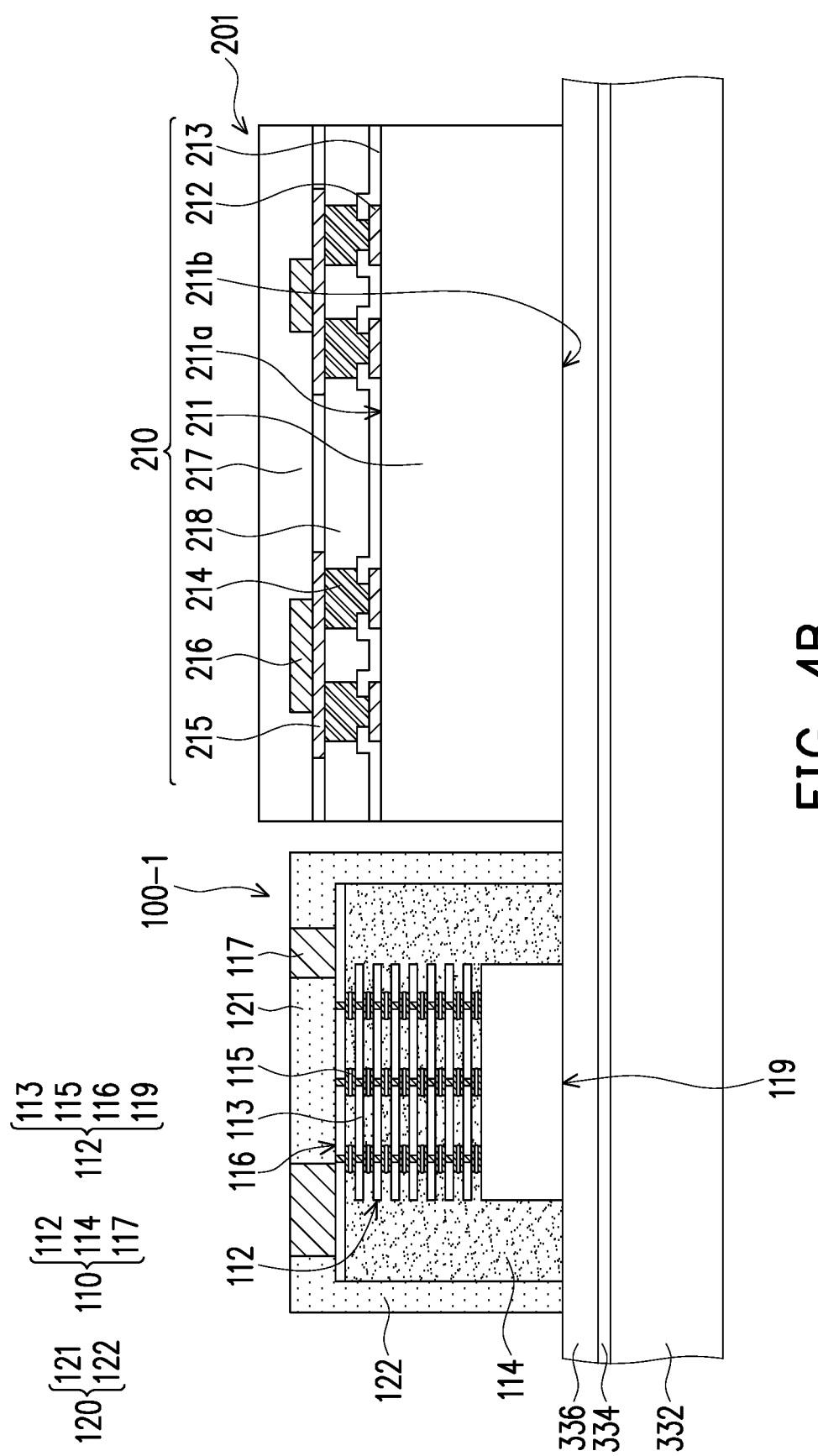

Referring to FIG. 4B, in some embodiments, the first die unit 100-1 alongside the second die unit 201 are respectively picked and placed to the adhesive layer 336. In some embodiments, the first die unit 100-1 includes at least one memory component 110. In some embodiments, the at least one memory component 110 includes a plurality of memory components, such as the abovementioned first memory component 110a, the second memory component 110b, and the third memory component 110c. As shown in FIG. 4B, only one memory component 110 is included in the first die unit 100-1 and presented for illustrative purposes, however, it should be noted that the number of the memory components 110 may be one or more than one, the disclosure is not limited thereto.

In some embodiments, additional first die units 100-1 may be picked and placed over the carrier 332 along with the above firstly placed first die unit 100-1. In some embodiments, the second die unit 201 may include at least one semiconductor chip structure 210. In some embodiments, the at least one semiconductor chip structure 210 may include one or more digital chips, analog chips or mixed signal chips, such as application-specific integrated circuit ("ASIC") chips, sensor chips, wireless and radio frequency (RF) chips, memory chips, logics chips or voltage chips, the disclosure is note limited hereto.

In some embodiments, additional second die units 201 might be disposed with the one mentioned above, the number of the second die units 201 may be adjusted based on the practical needs, the disclosure is not limited herein.

Figure 4C:
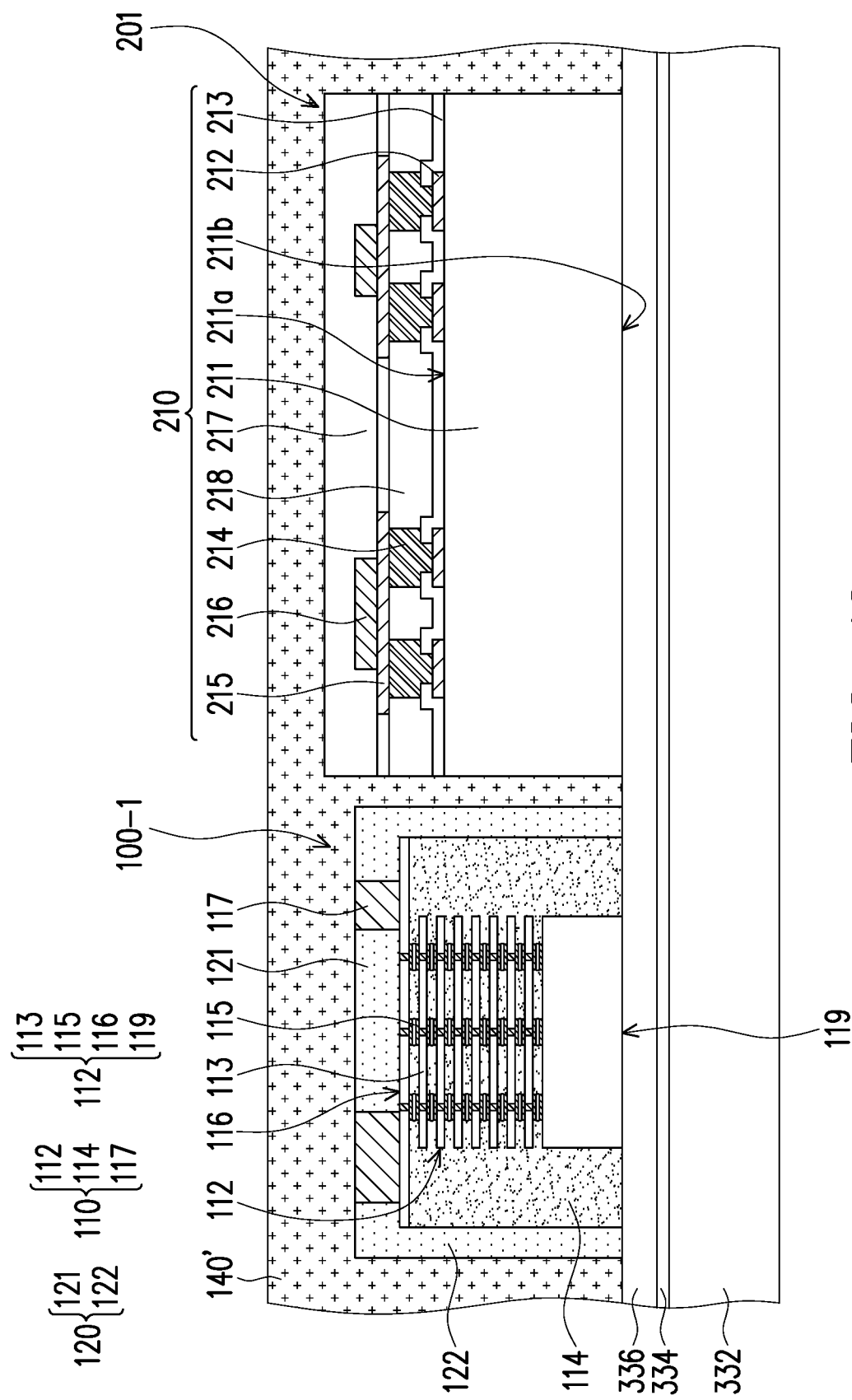

Referring to FIG. 4C, the first die unit 100-1 and the second die unit 201 are commonly encapsulated and fully covered by a second encapsulation material 140'. In some embodiments, the second encapsulation material 140' is different from the abovementioned first encapsulation material 120' for encapsulating the memory components 110. In some embodiments, the second encapsulation material 140' may include a molding compound or a polymer resin.

In some embodiments, the semiconductor chip structure 210 may include a semiconductor substrate 211 having an active surface 211a and a backside surface 211b opposite to the active surface 211a. A plurality of pads 212 distributed on the active surface 211a, and a passivation layer 213 covers the active surface 211a and a portion of the pads 212. Moreover, a plurality of conductive vias 214 physically connects to the pads 212 partially exposed by the passivation layer 213, and a protection layer 218 surrounds and protects the conductive vias 214 exposed by the passivation layer 213. As shown in FIG. 4B and FIG. 4C, the pads 212, the passivation layer 213, the conductive vias 214, and the protection layer 218 are formed above the semiconductor substrate 211.

However, the disclosure may be not limited thereto. For example, the conductive vias 214 and the protection layer 218 may be omitted. In some embodiments, the material of the semiconductor substrate 211 includes active components (e.g., transistor and/or memories such as N-type metal oxide semiconductor (NMOS) and/or P-type metal-oxide semiconductor (PMOS) devices, or the like), and/or passive components (e.g., resistors, capacitors, inductors or the like) formed therein. In some embodiments, such active components and passive components may be formed in a front-end-of-line (FEOL) process. In an alternative embodiment, the semiconductor substrate 211 may be a bulk silicon substrate, such a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In some embodiments, the semiconductor chip structure 210 may further include a redistribution circuit layer disposed on the protection layer 218 and the top surfaces of the conductive vias 214. As shown in FIG. 4B and FIG. 4C, the redistribution circuit layer may include a dielectric layer 217, a seed layer 215 and a metallization layer 216. In some embodiments, the seed layer 215 is formed on the top surfaces of the conductive vias 214. In the disclosure, the seed layer 215 is referred to as a metallic layer. In some embodiments, a material of the seed layer 215 may include titanium. The seed layer 215 may be formed using, for example, sputtering, physic vapor deposition (PVD), or the like. In some embodiments, the seed layer 215 is conformally formed on the conductive vias 214 and the protection layer 218 as a thin layer composed of titanium. In addition, as shown in FIG. 4B and FIG. 4C, in certain embodiments, the seed layer 215 is in physical contact with the top surfaces of the conductive vias 214 and the protection layer 218.

Figure 4D:
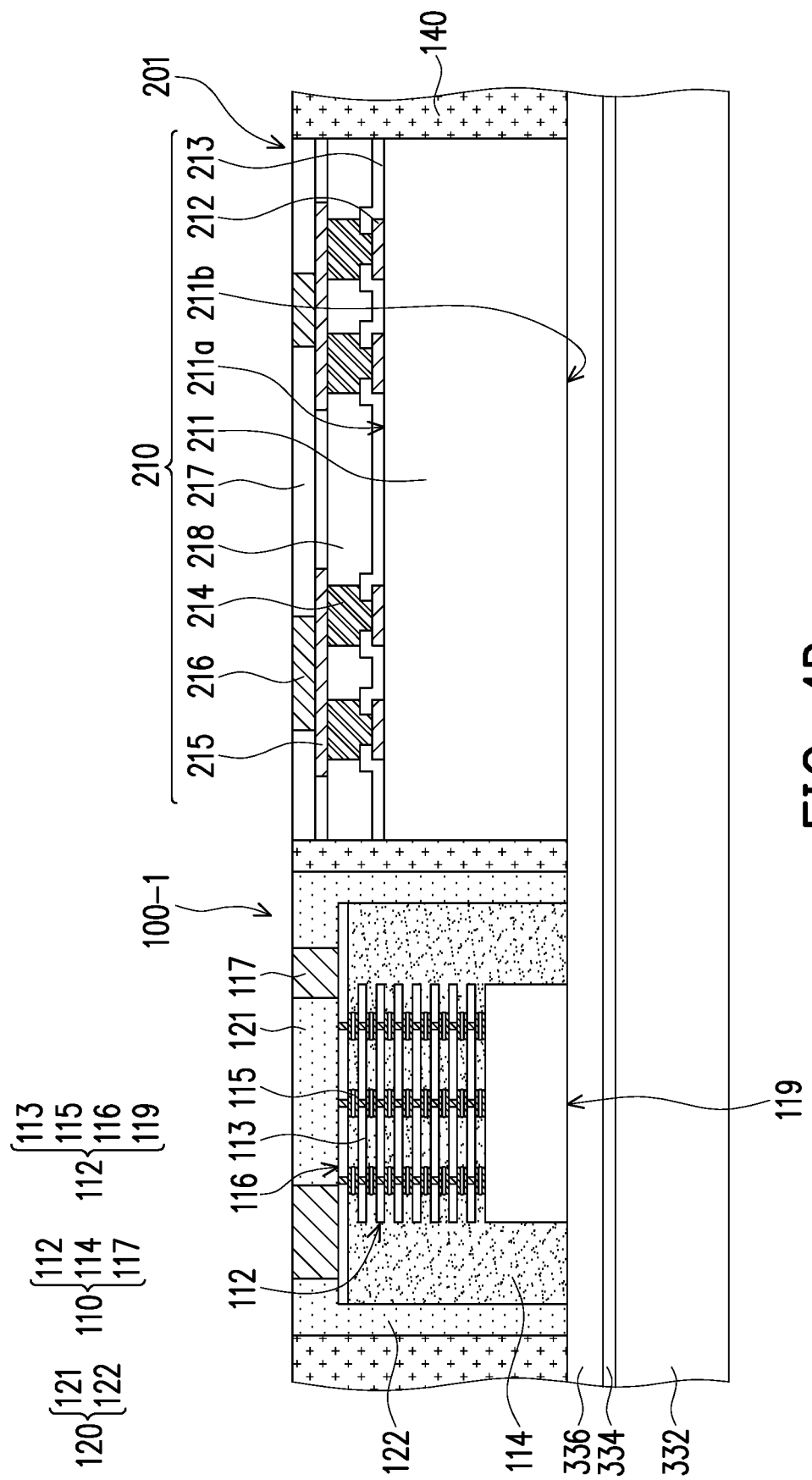

Referring to FIG. 4D, in some embodiments, the second encapsulation material 140' is grinded and planarized to form a second insulating encapsulation 140 to make the thickness of the first die unit 100-1 substantially equal with the thickness of the second die unit 201, and the covering portion 121 of the first insulating encapsulation 120, the conductive posts 117, the metallization layer 216 and the dielectric layer 217 of the semiconductor chip structure 210 are exposed from the second insulating encapsulation 140. As shown in FIG. 4D, the top surfaces of the covering portion 121, the conductive posts 117, the metallization layer 216, the dielectric layer 217 and the second insulating encapsulation 140 are collectively to form a flat surface, which is levelled and may have a high degree of coplanarity with a variation for example, less than 5 microns. In some embodiments, the second encapsulation material 140' may be planarized by mechanical grinder or chemical mechanical polishing (CMP), for example. After the planarizing step, a cleaning step may be optionally performed, for example, to clean and remove the residue generated from the planarizing step. However, the disclosure is not limited thereto, and the planarizing step may be performed through any suitable method.

Figure 4E:
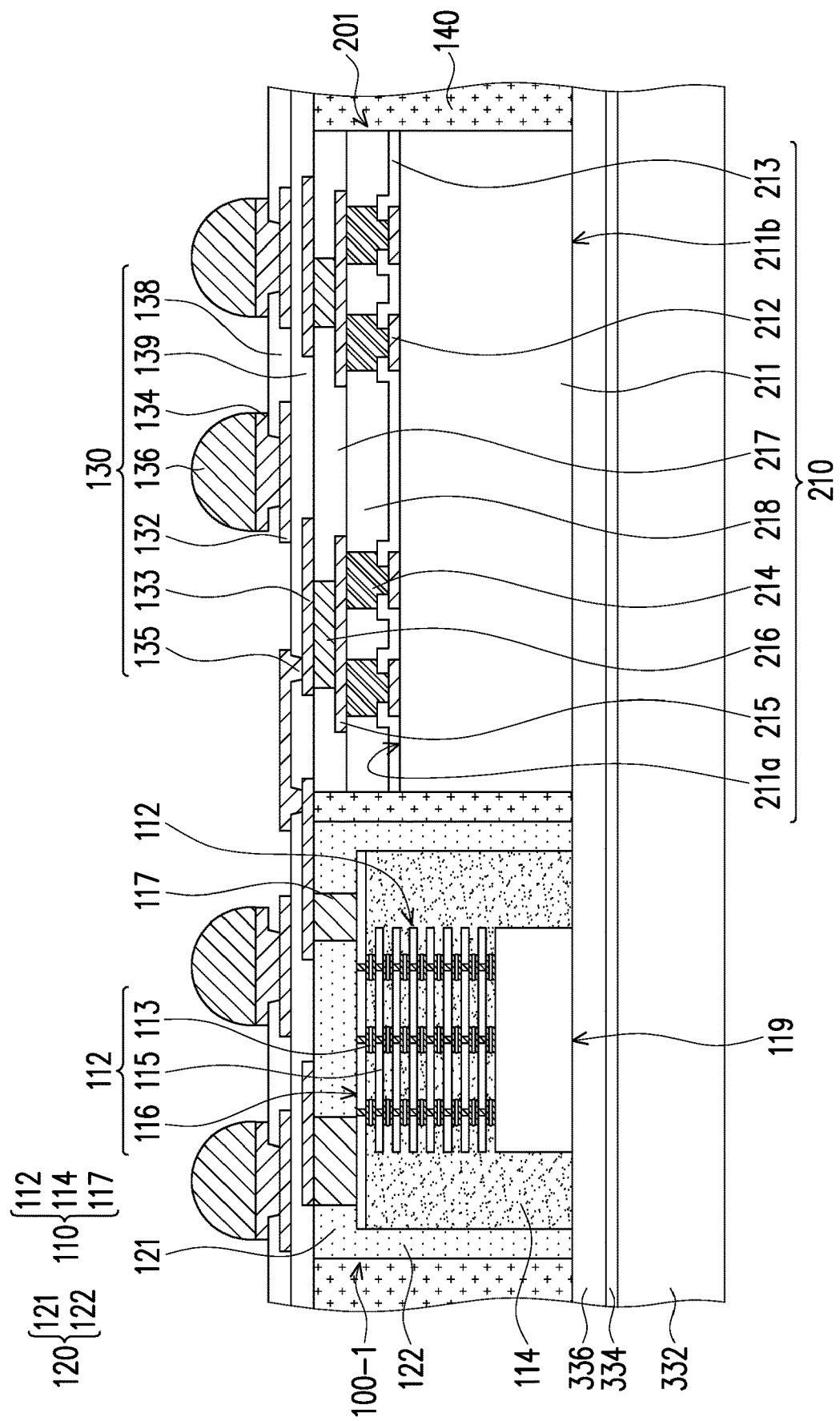

Referring to FIG. 4E, in some embodiments, the above-mentioned redistribution structure 130 is formed on the planarized surface collectively formed by the top surfaces of the first die unit 100-1, the second die unit 201, and the second insulting encapsulation 140. In some embodiments, as shown in FIG. 4E, the redistribution structure 130 includes a plurality of dielectric layer, for example, dielectric layers 138, 139. However, in the disclosure, the number of the dielectric layer is not limited to what is depicted in FIG. 4E.

In some embodiments, a seed layer 133 is formed on the above-mentioned planarized surface on the top of the first die unit 100-1, second die unit 201 and the second insulating encapsulation 140. For example, the seed layer 133 is formed in a form of a blanket layer made of metal or metal alloy materials, the disclosure is not limited herein. In some embodiments, the seed layer 133 is electrically connected and physically contacted with the conductive posts 117 and the metallization layer 216. In the disclosure, the seed layer 133 is referred to as a metallic seed layer. In some embodiments, a material of the seed layer 133 may include titanium. The seed layer 133 may be formed using, for example, sputtering, physical vapor deposition (PVD), or the like. In addition, in an alternative embodiment, the metallization layer 132 is formed by plating process. In some embodiments, the conductive vias 135 may be formed by a material substantially the same or similar to the material of the metallization layer 132 to electrically connect the metallization layer 132 and the seed layer 133. In some embodiments, the material of the conductive vias 135 may include a metal material such as copper or copper alloys, or the like. In some embodiments, the conductive vias 135 are formed by photolithography, plating, photoresist stripping process or any other suitable method. For example, the plating process may include an electroplating plating, an electroless plating or the like. However, the disclosure is not limited thereto.

Referring again to FIG. 4E, the UBM patterns 134 are formed between the metallization layer 132 and the conductive elements 136. In some embodiments, the UBM patterns 134 are formed in a manner of a multi-layer (e.g., with different materials in any two adjacent layers in UBM patterns 134) by, for example, an electroplating process.

In some embodiments, through the conductive elements 136 and/or additional connectors, the first die unit 100-1 and the second die unit 201 may be further mounted with a circuit substrate (e.g., an organic substrate with circuitry structure embedded therein, such as printed circuit board (PCB), an interposer, an additional package, chips/dies or other electronic devices, to form a stacked package structure, the disclosure is not limited thereto.

Figure 4F:
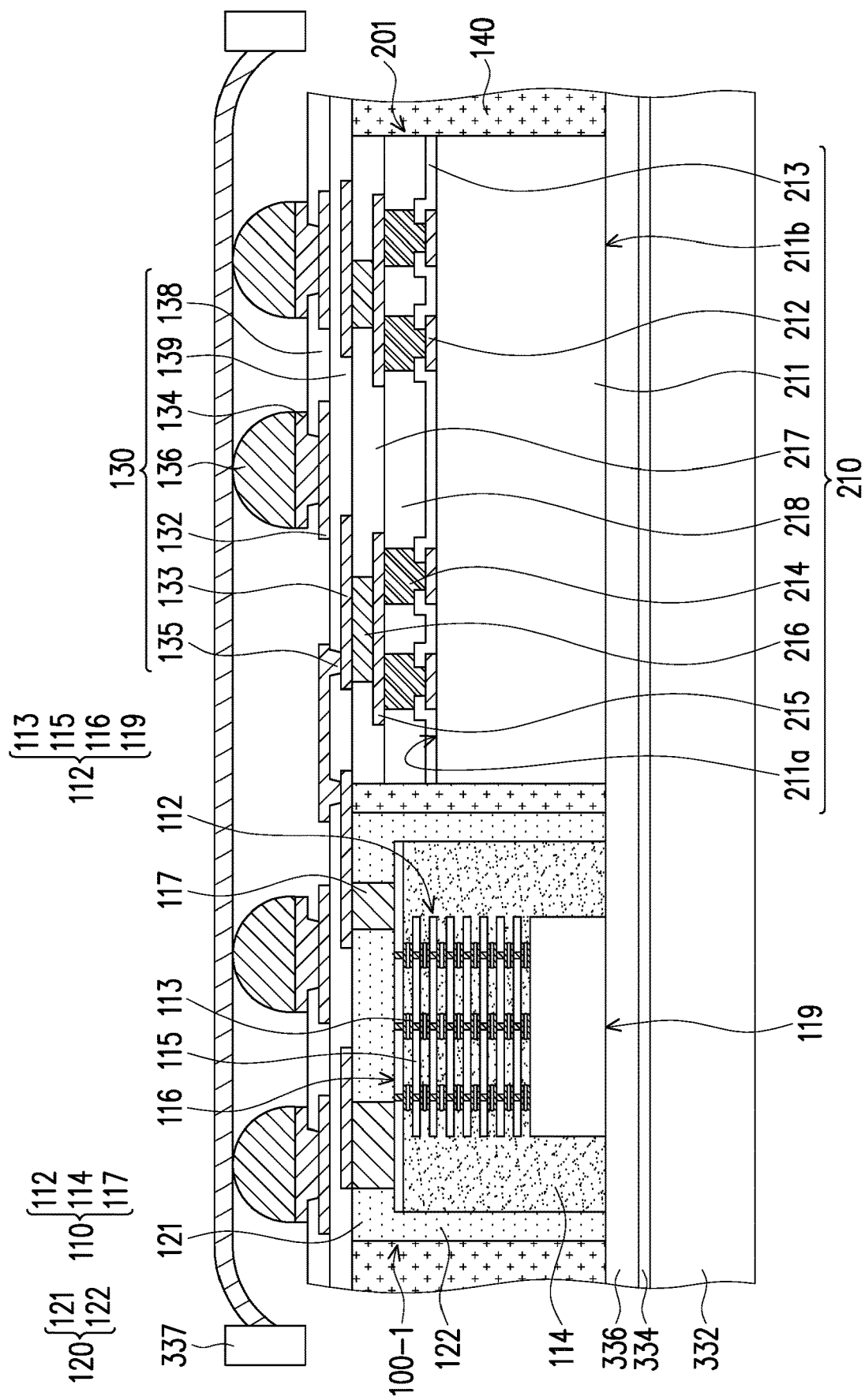

Continued on in FIG. 4F, a carrier 337 is attached to the conductive elements 136. In addition, the carrier 332 could be debonded through the debond layer 334 and the adhesive layer 336 to expose the backside 119 of the stacked memory structure 112, the backside surface 211b of the semiconductor substrate 211, and a bottom surface of the second insulating encapsulation 140. In some embodiments, the carrier 337 is, for example, an adhesive tape.

Figure 4G:
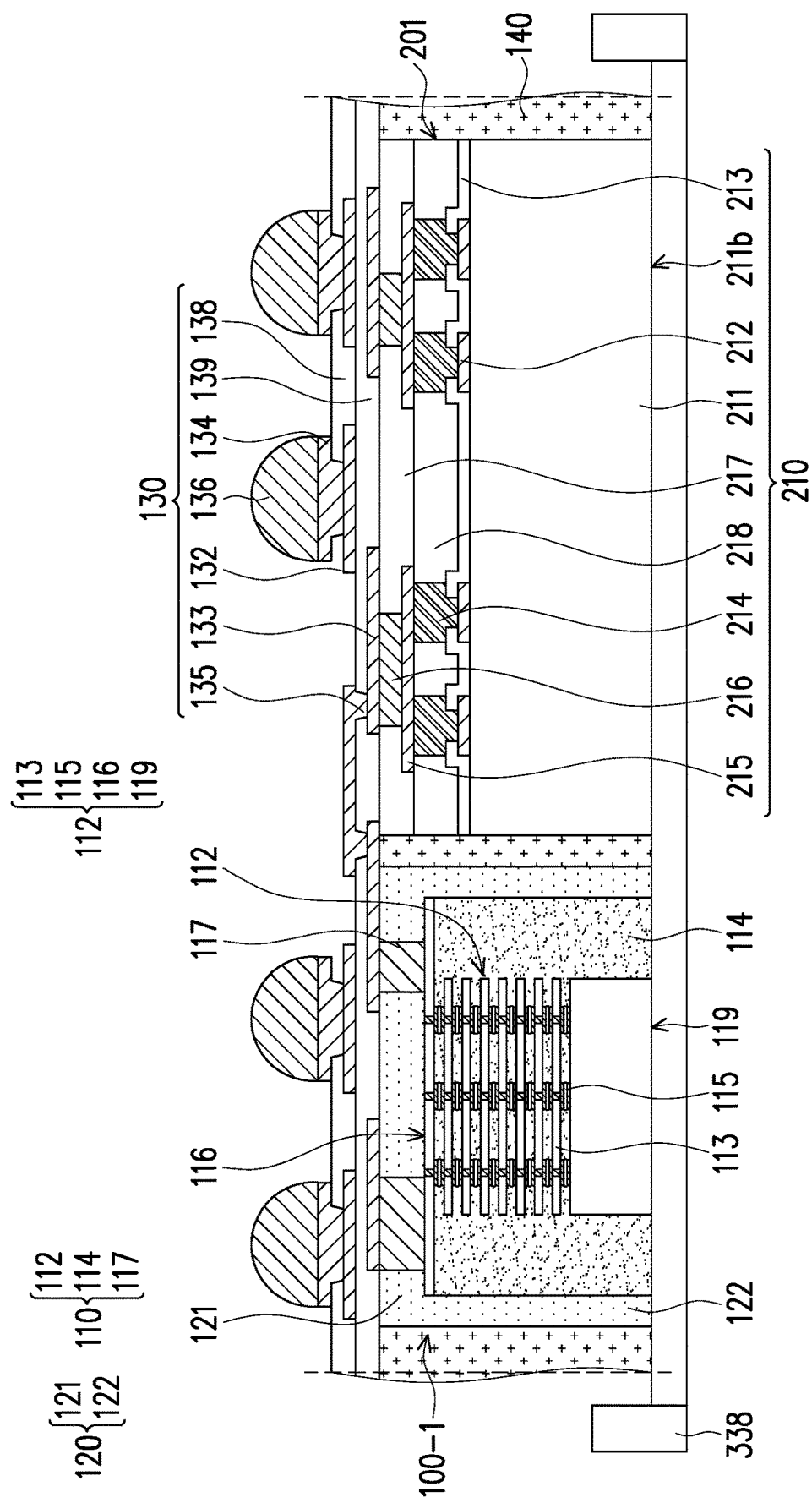

Referring to FIG. 4G, a carrier 338 is attached to the backside 119 of the stacked memory structure 112, the backside surface 211b of the semiconductor substrate 211, and the bottom surface of the second insulating encapsulation 140, so as to remove the carrier 337 from the conductive elements 136. In some embodiments, the carrier 338 is, for example, an adhesive tape. In addition, the second insulating encapsulation 140 is sawed to separate each of the packages 200 simultaneously formed.

Figure 4H:
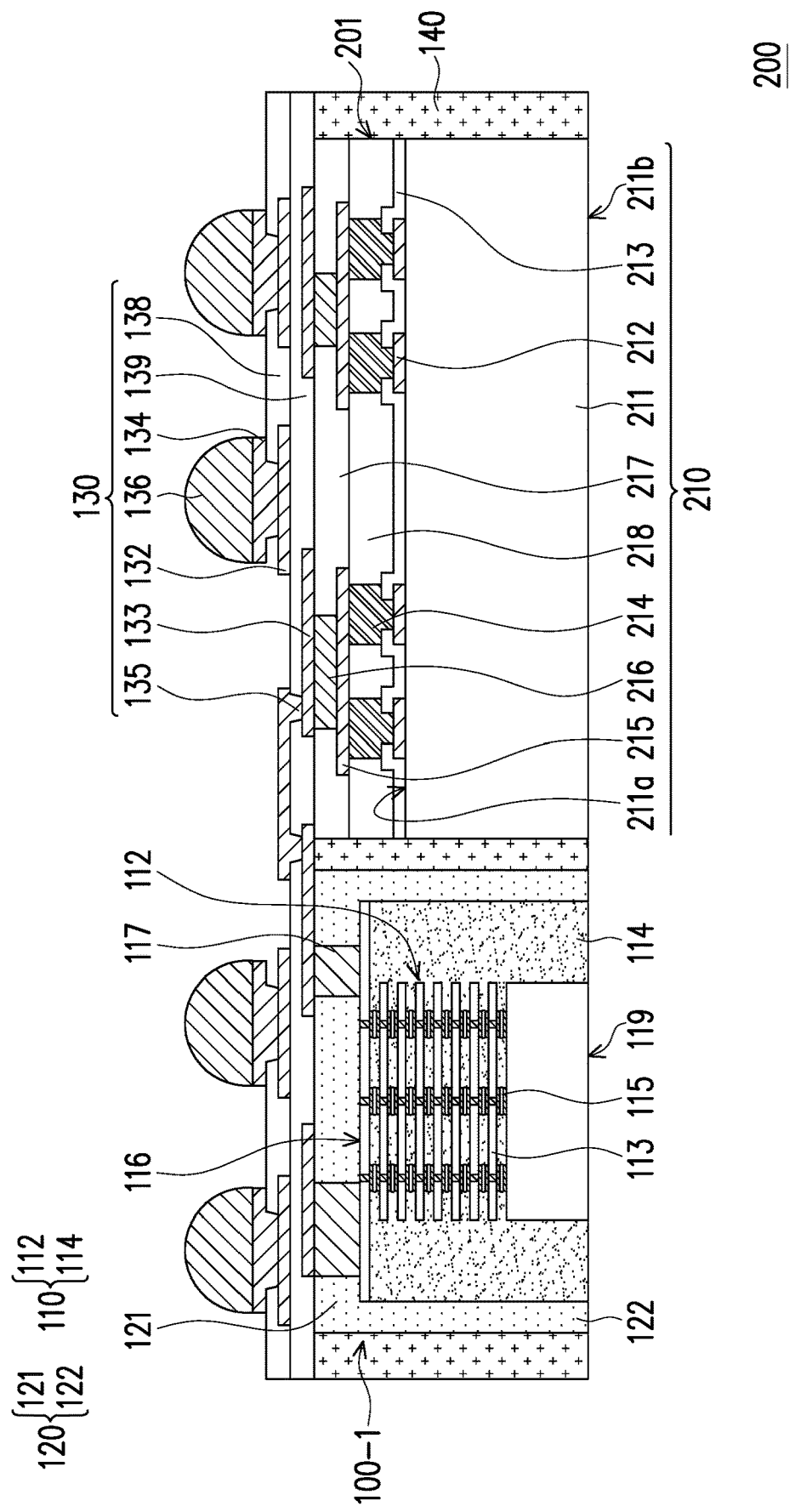

Continued on in FIG. 4H, the carrier 338 is removed to form the package 200 and up to here, the manufacturing process of the package 200 is completed.

Figure 5:
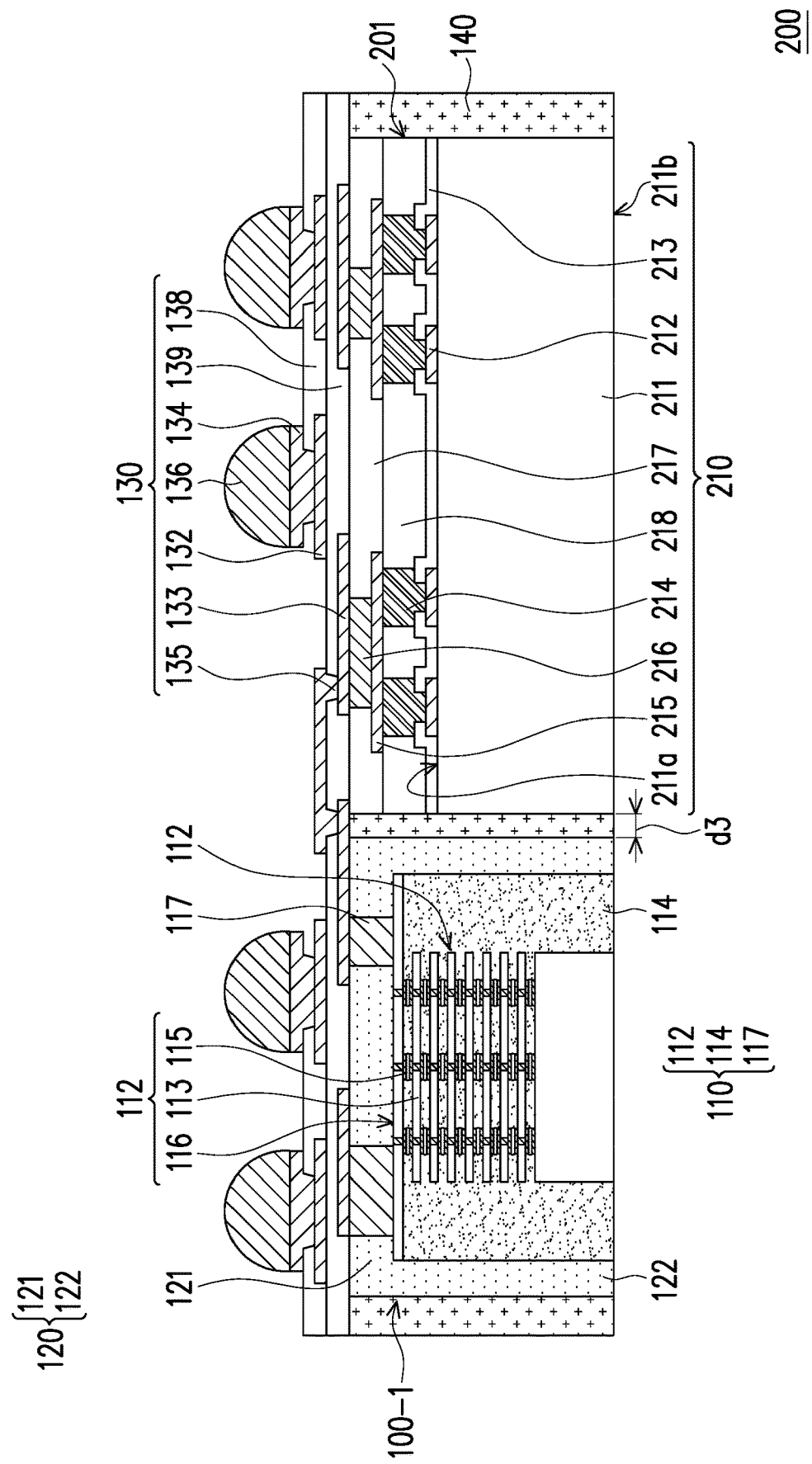
FIG. 5 is a schematic cross-section view illustrating a package of a memory component and a semiconductor chip structure in accordance with some embodiments of the disclosure.

FIG. 5 is a schematic cross-section view illustrating a package 200 of a memory component 110 and a semiconductor chip structure 210 in accordance with some embodiments of the disclosure. Referring to FIG. 5, in some embodiments, the package 200 may be fabricated by the process in FIG. 4A through FIG. 4G and may include the at least one memory component 110, the first insulating encapsulation 120, the redistribution structure 130, the second insulating encapsulation 140, and the semiconductor chip structure 210. As shown in FIG. 5, the memory component 110 is commonly encapsulated in the first insulating encapsulation 120 with the semiconductor chip structure 210. In some embodiments, the memory component 110 includes the stacked memory structure 112, the molding compound 114, and the conductive posts 117. The stacked memory structure 112 includes the memory chips 113 stacked over one another, the interconnecting structures 115, and the upper surface 116. The stacked memory structure 112 is molded in the molding compound 114, and the conductive posts 117 are disposed on the upper surface 116. The interconnecting structures 115 respectively pass through the memory chips 113 and connect the memory chips to the conductive posts 117. In some embodiments, the first insulating encapsulation 120 may include the covering portion 121 and the side wall portion 122. As shown in FIG. 5, the covering portion 121 overlaying the upper surface 116 of the stacked memory structure 112, and the side wall portion 122 surrounds the sidewalls of the memory component 110. In addition, the second insulating encapsulation 140 encapsulates the memory component 110 and the first insulating encapsulation 120 and exposes the covering portion 121 thereof. As shown in FIG. 5, in some embodiments, the first insulating encapsulation 120 is sandwiched between the second insulating encapsulation 140 and the molding compound 114.

Referring again FIG. 5, the semiconductor chip structure 210 is encapsulated and embedded in the second insulating encapsulation 140 and arranged aside of the memory component 110. Moreover, the redistribution structure 130 is overlaying and electrically connected to the memory component 110 and the semiconductor chip structure 210. In some embodiments, a material of the first insulating encapsulation 120 may be the molded underfill (MUF), the disclosure is not limited thereto. In some embodiments, the material of the first insulating encapsulation 120 may be different from a material of the second insulating encapsulation 140. In some embodiments, the material of the first insulating encapsulation 120 may be also different from the molding compound 114 that molds the stacked memory structure 112. Still in some embodiments, the materials of the molding compound 114, the first insulating encapsulation 120, and the second insulating encapsulation 140 may be all different from one another. In the disclosure, through configuring the first insulating encapsulation 120 having different forming material from the second insulating encapsulation 140 or the molding compound 114, the first insulating encapsulation 120 has a better adhesion with the molding compound 114 than with the second insulating encapsulation 140. Accordingly, an enhancement of the adhesion between the molding compound 114 and the first insulating encapsulation 120 could reduce the issues of the delamination therebetween and thus reliability of the package 200 could be further improved.

In some embodiments, the semiconductor chip structure 210 may include the semiconductor substrate 211 having the active surface 211a and the backside surface 211b opposite to the active surface 211a. A plurality of pads 212 distributed on the active surface 211a, and the passivation layer 213 covers the active surface 211a and a portion of the pads 212. Moreover, a plurality of the conductive vias 214 physically connects the pads 212 partially exposed by the passivation layer 213, and the protection layer 218 surrounds and protects the conductive vias 214 exposed by the passivation layer 213. As shown in FIG. 5, the pads 212, the passivation layer 213, the conductive vias 214, and the protection layer 218 are formed above the semiconductor substrate 211.

Moreover, the semiconductor substrate 211 may further include an interconnection structure (not shown) disposed on the active surface 211a. In some embodiments, the interconnection structure may include one or more inter-dielectric layers and one or more patterned conductive layers stacked alternately for providing routing function to the active compound and the passive compounds embedded in the semiconductor substrate 211, where the pads 212 may be referred to as an outermost layer of the patterned conducive layers. In certain embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

The pads 212 are, for example, aluminum pads or other suitable metal pads. The conductive vias 214 are, for example, copper pillars, copper alloy pillar or other suitable metal pillars containing copper metal. In some embodiments, the conductive vias 214 are formed by photolithography, plating, photoresist stripping process or any other suitable method. For example, the plating process may include an electroplating plating, an electroless plating or the like. However, the disclosure is not limited thereto.

In some embodiments, the passivation layer 213 and the protection layer 218 may be a PBO layer, a PI layer or other suitable polymers. In some alternative embodiments, the passivation layer 213 and the protection layer 218 may be made of inorganic materials, such as silicon oxide, silicon nitride, silicon oxynitride, or any suitable dielectric material. In some embodiments, the protection layer 218 in a form of a blanket layer made of metal or metal alloy materials, the disclosure is not limited thereto. The material of the passivation layer 213, for example, can be the same or different from the material of the protection layer 218.

In some embodiments, the semiconductor chip structure 210 may be referred to as an integrated circuit (IC). In an alternative embodiment, the semiconductor chip structure 210 may include one or more digital chips, analog chips or mixed signal chips, such as application-specific integrated circuit ("ASIC") chips, sensor ships, wireless and radio frequency (RF) chips, memory chips, logic chips or voltage regulator chips.

Referring again to FIG. 5, the redistribution structure 130 are formed above the memory component 110 and the semiconductor chip structure 210. The redistribution structure 130 may include a metallization layer 132, a seed layer 133, a plurality of under-ball metallurgy (UBM) patterns 134, a plurality of conductive vias 135, a plurality of conductive elements 136, and the dielectric layers 138, 139. The seed layer 133 is formed on the conductive posts 117, the metallization layer 216, the first insulating encapsulation 120, the second insulating encapsulation 140 and the dielectric layer 217. As shown in FIG. 5, the dielectric layer 139 partially exposes the seed layer 133 to electrically connect with the conductive vias 135. In addition, the dielectric layer 138 partially exposes the metallization layer 132 to electrically connect with the UBM patterns 134 and the conductive elements 136. As shown in FIG. 5, the conductive vias 135 connect the seed layer 133 and the metallization layer 132. In addition, the conductive elements 136 are disposed above the metallization layer 132. In some embodiments, the conductive elements 136 include solder balls or ball grid array (BGA) balls. In addition, the UBM patterns 134 are respectively disposed between the conductive elements 136 and the metallization layer 132 to avoid solder materials diffusing from the conductive elements 136 to the redistribution structure 130, thereby ensuring the performance of the package 200. In some embodiments, the materials of UBM patterns 134 include copper, nickel, titanium, tungsten or alloys thereof or the like, and may be formed in a manner of a multi-layer (e.g., with different materials in any two adjacent layers in the UBM patterns 134) by an electroplating process, for example. The number of the UBM patterns 134 is not limited in this disclosure.

In some embodiments, materials of the metallization layer 132 and the metallization layer 216 may include a metal material such as copper or copper alloys, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The number of patterns of the metallization layers 132 and 216 can be selected based on the demand. In some embodiments, the metallization layers 132 and 216 are formed by plating process.

Referring to FIG. 5, in some embodiments, a gap width d3 between the memory component 110 and the semiconductor chip structure 210 may be smaller than a thickness of the side wall portion 122 of the first insulating encapsulation 120, the disclosure is not limited herein. For example, in some embodiments, the gap width d3 between the memory component 110 and the semiconductor chip structure 210 is less than 2 microns. Accordingly, a fine pitch redistribution line (RDL) may be implemented between the memory component 110 and the semiconductor chip structure 210.

Figure 6:
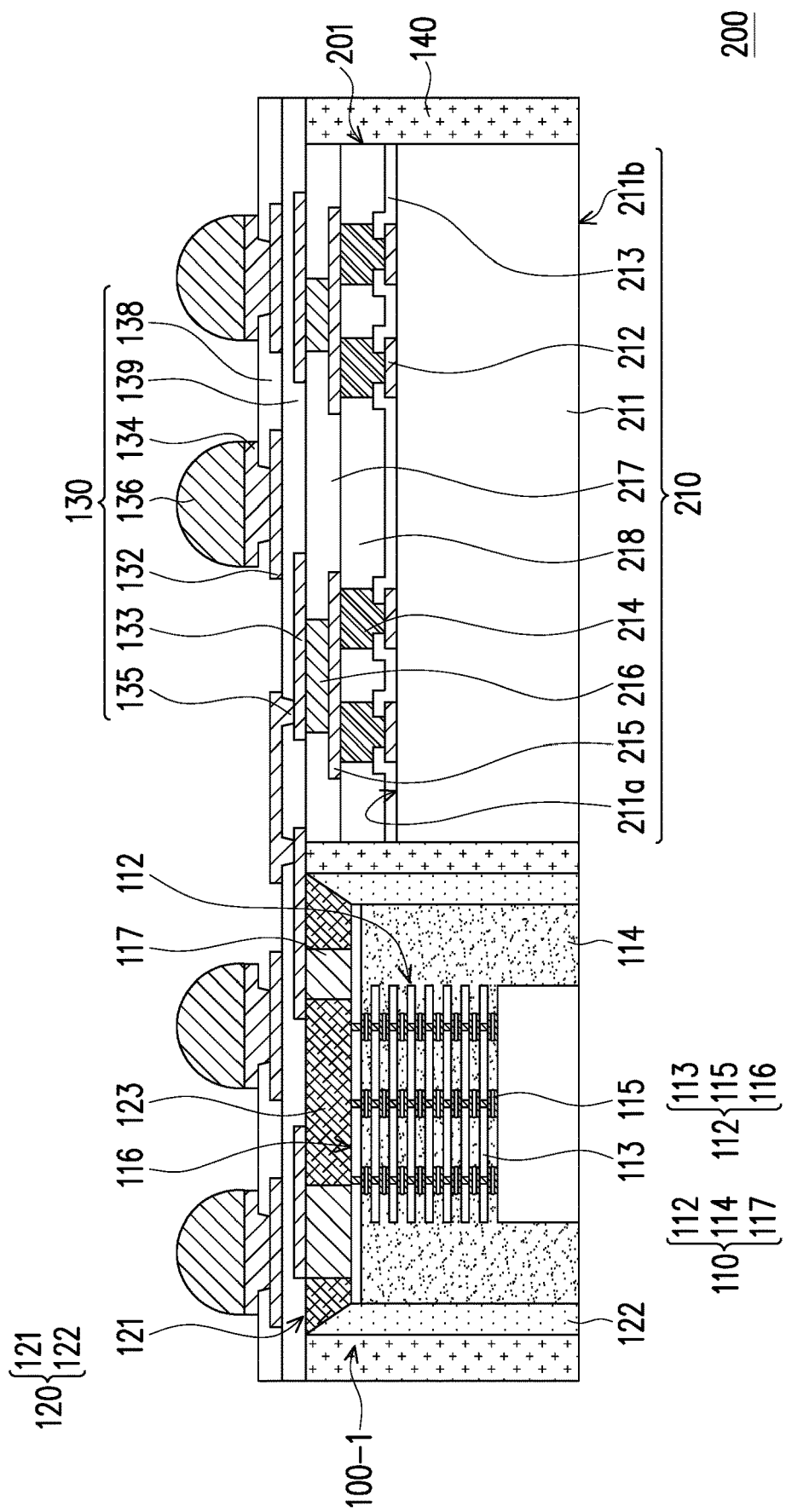
FIG. 6 is a schematic cross-section view illustrating a package of a memory component and a semiconductor chip structure in accordance with some embodiments of the disclosure.

FIG. 6 is a schematic cross-section view illustrating a package 200 of a memory component 110 and a semiconductor chip structure 210 in accordance with some embodiments of the disclosure. Referring to FIG. 6, in some embodiments, the covering portion 121 of the first insulating encapsulation 120 may include an underfill layer 123, sandwiched between the redistribution structure 130 and the memory component 110, and the underfill layer 123 surrounds side surfaces of the conductive posts 117. The underfill layer 123 is provided to fill the gap between the redistribution structure 130 and the memory component 110, which enhances the bonding strength between the redistribution structure 130 and the memory component 110; thereby improving the reliability of the package 200.

Figure 7:
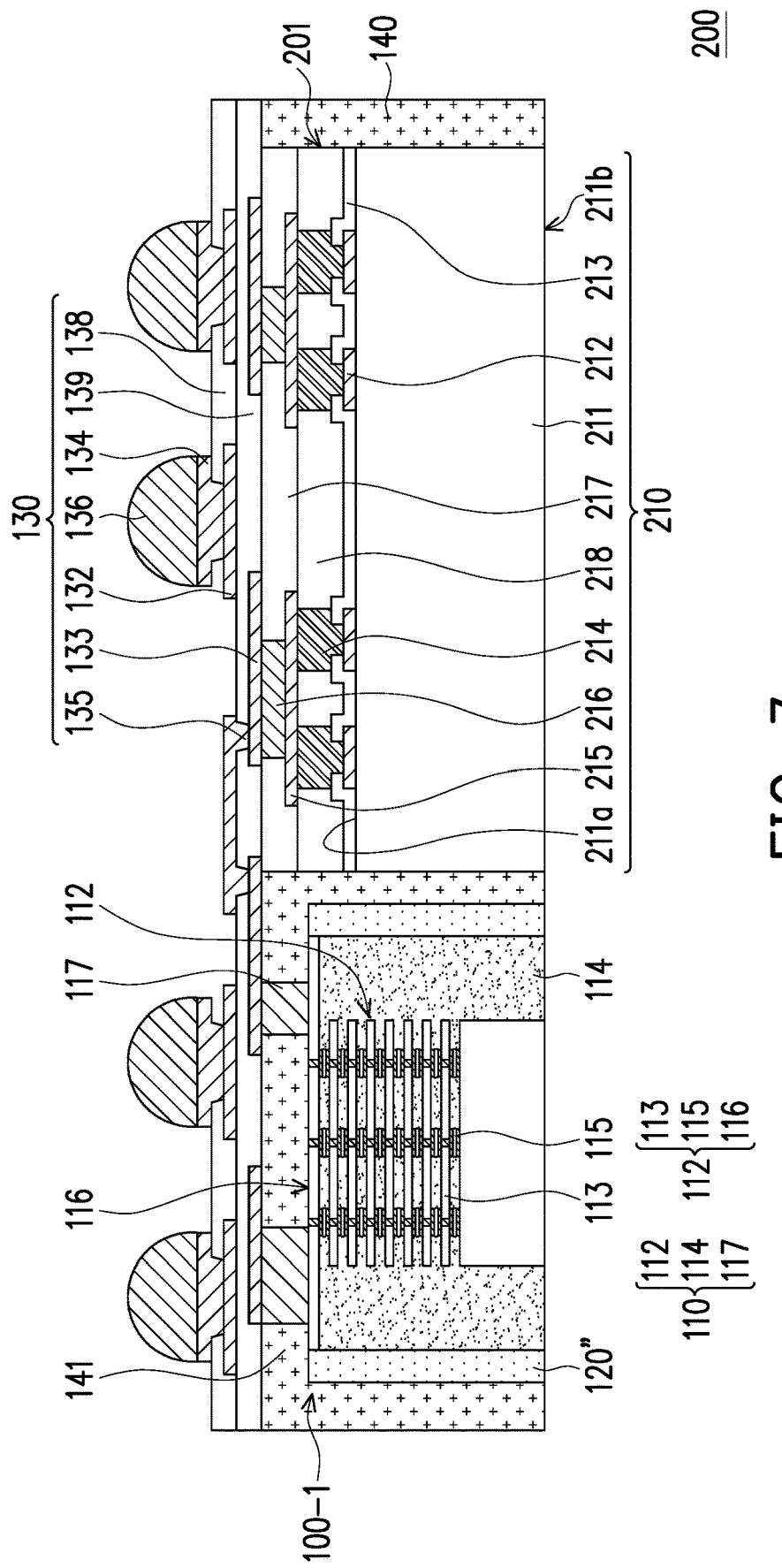
FIG. 7 is a schematic cross-section view illustrating a package of a memory component and a semiconductor chip structure in accordance with some embodiments of the disclosure.

FIG. 7 is a schematic cross-section view illustrating a package 200 of a memory component 110 and a semiconductor chip structure 210 in accordance with some embodiments of the disclosure. Referring to FIG. 7, in some embodiments, the upper surface 116 of the stacked memory structure 112, the top surfaces of the molding compound 114 and a first insulating encapsulation 120" may be directly covered by the second insulating encapsulation 140 without being further covered by the cover portion 121 or the underfill layer 123 as shown in FIG. 5 and FIG. 6. As shown in FIG. 7, in some embodiments, the first insulating encapsulation 120" of the package 200 covers merely the sidewalls the molding compounds 114 of the memory component 110 without further covering the upper surface 116 of the stacked memory structure 112 or surrounding the conductive posts 117.

Figure 8:
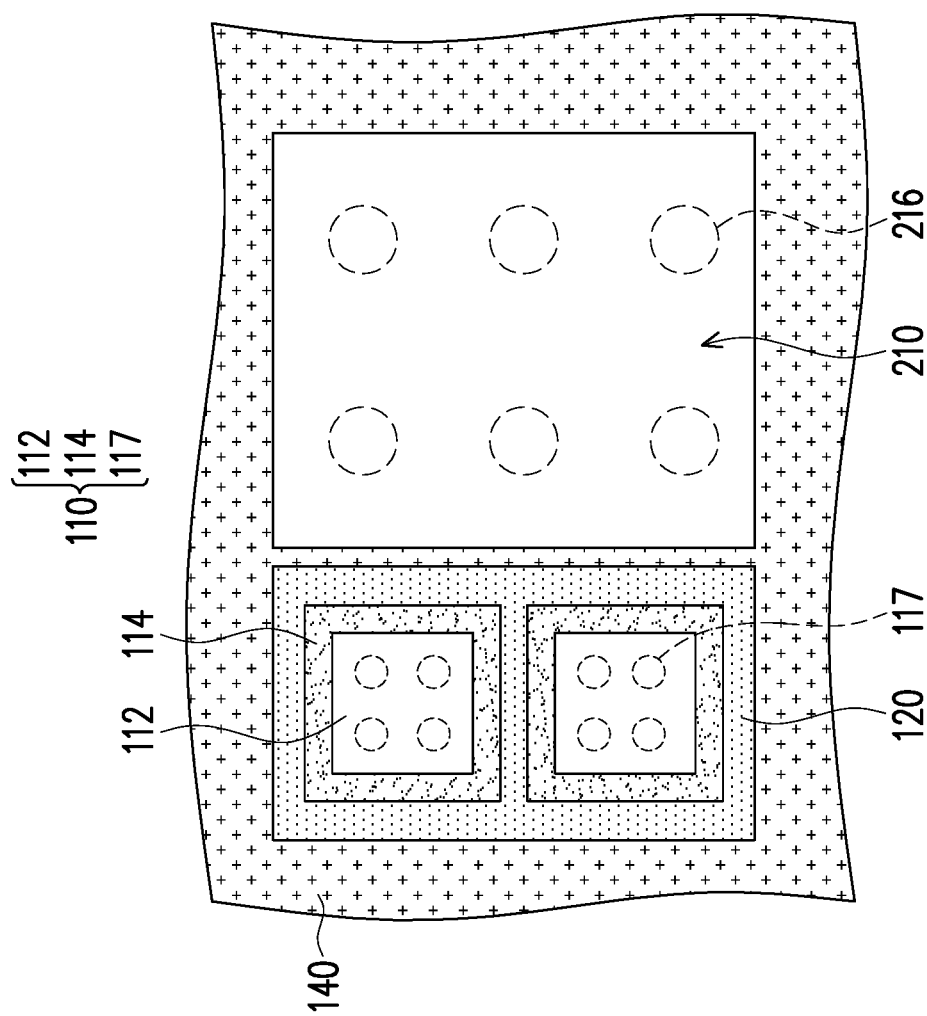
FIG. 8 is a schematic top view illustrating a package of a memory component and a semiconductor chip structure in accordance with some embodiments of the disclosure.

FIG. 8 is a schematic top view illustrating a package 200 of a memory component 110 and a semiconductor chip structure 210 in accordance with some embodiments of the disclosure. In some embodiments, a single semiconductor chip structure 210 may be commonly encapsulated with a plurality of memory components 110, the disclosure is not limited thereto. As shown in FIG. 8, in some embodiments, the two memory components 110 are commonly encapsulated in the first insulating encapsulation 120 to form a die unit. The die unit having the memory components 110 may be further commonly encapsulated with another die unit including one or more semiconductor chip structure 210 in the second insulating encapsulation 140 to form the package 200. In some embodiments, each of the memory components 110 may respectively include a stacked memory structure 112 molded in the molding compound 114. In some embodiments, the numbers of the memory components 100 and the semiconductor chip structures 210 encapsulated in the package 200 may be varied based on the practical needs and design, the disclosure is not limited herein.

In accordance with some embodiments, a package includes at least one memory component and an insulating encapsulation. The at least one memory component includes a stacked memory structure and a plurality of conductive posts. The stacked memory structure is laterally encapsulated in a molding compound. The conductive posts are disposed on an upper surface of the stacked memory structure. The upper surface of the stacked memory structure is exposed from the molding compound. The insulating encapsulation encapsulates the at least one memory component. The top surfaces of the conductive posts are exposed form the insulating encapsulation. A material of the molding compound is different a material of the insulating encapsulation.

In accordance with some embodiments, a package includes a first insulating encapsulation, at least one memory component, a second insulating encapsulation, and a semiconductor chip structure and a redistribution structure. The at least one memory component is encapsulated in the first insulating encapsulation. The at least one memory component includes a stacked memory structure. The stacked memory structure is molded in a molding compound. The first insulating encapsulation includes a covering portion and a side wall portion. The covering portion overlays an upper surface of the stacked memory structure. The side wall portion surrounds sidewalls of the at least one memory component. The second insulating encapsulation encapsulates the at least one memory component and exposes the covering portion of the first insulating encapsulation. The first insulating encapsulation is sandwiched between the second insulating encapsulation and the molding compound. The semiconductor chip structure is embedded in the second insulating encapsulation and arranged aside the at least one memory component. The redistribution structure overlays and is electrically connected to the at least one memory component and the semiconductor chip structure.

In accordance with some embodiments, a manufacturing method of a package includes providing a carrier and disposing first and second memory components on the carrier. The first memory component has a thickness different from a thickness of the second memory component. The first and second memory components are encapsulated with a first encapsulation material. The first encapsulation material is planarized to form a first insulating encapsulation and to make the thickness of the first memory component substantially equal with the thickness of the second memory component with backsides of the first and second memory components exposed. The first insulting encapsulation is cut through to separate first die units. The first die unit include the first and/or second memory components encapsulated therein. The first die units are disposed alongside second die units. The first and second die units are encapsulated with a second encapsulation material. The second encapsulation material is different the first encapsulation material. The second encapsulation material is planarized to form a second insulating encapsulation and to expose the first and second die units. The redistribution structure is formed over the second insulating encapsulation and the first and second die units to electrically connect first and second die units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first insulating encapsulation;
   at least one memory component, encapsulated in the first insulating encapsulation, wherein the at least one memory component comprises a stacked memory structure molded in a molding compound, wherein the first insulating encapsulation comprises a covering portion and a side wall portion, the covering portion overlaying an upper surface of the stacked memory structure, and the side wall portion surrounds sidewalls of the at least one memory component;
   a second insulating encapsulation, encapsulating the at least one memory component and exposing the covering portion of the first insulating encapsulation, wherein the first insulating encapsulation is sandwiched between the second insulating encapsulation and the molding compound;
   a semiconductor chip structure, embedded in the second insulating encapsulation and arranged aside the at least one memory component; and
   a redistribution structure, overlaying and electrically connected to the at least one memory component and the semiconductor chip structure.

2. The package of claim 1, wherein the first insulating encapsulation and the second insulating encapsulation are made of different materials.

3. The package of claim 1, wherein a gap width between the at least one memory component and the semiconductor chip structure is smaller than a thickness of the side wall portion of the first insulating encapsulation.

4. The package of claim 1, wherein the covering portion comprises an underfill layer filled between the redistribution structure and the at least one memory component.

5. The package of claim 4, wherein a material of the underfill layer is different from a material of the first insulating encapsulation.

6. The package of claim 1, wherein a material of the covering portion is same as a material of the second insulating encapsulation.

7. The package of claim 1, wherein an adhesion between the first insulating encapsulation and the molding compound is greater than an adhesion between the second insulating encapsulation and the first insulating encapsulation.

8. The package of claim 1, further comprising a plurality of conductive posts disposed over the upper surface and exposed from the covering portion of the first insulating encapsulation to electrically connect the redistribution structure and the at least one memory component.

9. The package of claim 1, wherein the first insulating encapsulation and the molding compound are made of different materials.

10. The memory package of claim 1, wherein the stacked memory structure comprises a plurality of memory chips interconnected and stacked over one another.

11. The package of claim 10, wherein a plurality of interconnecting structures electrically connects the plurality of memory chips.

12. The package of claim 1, wherein the at least one memory component comprises a high bandwidth memory (HBM) component.

13. The package of claim 1, wherein a gap distance between the at least one memory component and the semiconductor chip structure is less than 2 microns.

14. The package of claim 1, wherein a gap distance between the at least one memory component and the semiconductor chip structure is smaller than a thickness of the side wall portion of the first insulating encapsulation.

* * * * *